United States Patent

Takeyasu et al.

Patent Number: 5,952,723
Date of Patent: Sep. 14, 1999

[54] SEMICONDUCTOR DEVICE HAVING A MULTILEVEL INTERCONNECTION STRUCTURE

[75] Inventors: Nobuyuki Takeyasu; Hiroshi Yamamoto; Yumiko Kawano; Eiichi Kondoh; Tomoharu Katagiri, all of Chiba; Tomohiro Ohta, Urayasu, all of Japan

[73] Assignee: Kawasaki Steel Corporation, Kobe, Japan

[21] Appl. No.: 08/827,411

[22] Filed: Mar. 27, 1997

Related U.S. Application Data

[62] Division of application No. 08/172,717, Dec. 27, 1993, Pat. No. 5,637,534.

[30] Foreign Application Priority Data

| Dec. 25, 1992 | [JP] | Japan | 4-346838 |
| Jan. 25, 1993 | [JP] | Japan | 5-010078 |
| Jun. 11, 1993 | [JP] | Japan | 5-140883 |
| Jun. 17, 1993 | [JP] | Japan | 5-146430 |

[51] Int. Cl.$^6$ ................................. H01L 23/48
[52] U.S. Cl. ............................ 257/771; 257/773
[58] Field of Search ................. 257/771, 773, 257/775, 758

[56] References Cited

U.S. PATENT DOCUMENTS

| 4,640,737 | 2/1987 | Nagasaka et al. . |
| 4,666,737 | 5/1987 | Gimpelson et al. . |
| 4,924,295 | 5/1990 | Kuecher . |
| 4,970,176 | 11/1990 | Tracey et al. . |
| 5,006,484 | 4/1991 | Harada . |
| 5,043,299 | 8/1991 | Chang et al. . |
| 5,151,305 | 9/1992 | Matsumoto et al. . |
| 5,179,042 | 1/1993 | Mikoshiba et al. . |
| 5,234,864 | 8/1993 | Kim et al. . |
| 5,250,465 | 10/1993 | Lizuka et al. . |
| 5,288,665 | 2/1994 | Nulman . |
| 5,305,519 | 4/1994 | Yamamoto et al. . |
| 5,316,972 | 5/1994 | Mikoshiba et al. . |
| 5,360,524 | 11/1994 | Hendel et al. . |
| 5,374,592 | 12/1994 | Mac Naughton et al. . |
| 5,383,970 | 1/1995 | Asaba et al. . |
| 5,418,187 | 5/1995 | Miyanaga et al. . |
| 5,429,710 | 7/1995 | Akiba et al. . |
| 5,470,792 | 11/1995 | Yamada . |
| 5,482,893 | 1/1996 | Okabe et al. . |
| 5,486,492 | 1/1996 | Yamamoto et al. . |
| 5,633,201 | 5/1997 | Choi . |

FOREIGN PATENT DOCUMENTS

| 0-498550 | 8/1992 | European Pat. Off. . |
| 62-11227 | 1/1987 | Japan . |
| 1-255250 | 10/1989 | Japan . |
| 2-132825 | 5/1990 | Japan . |
| 3-291920 | 12/1991 | Japan . |

OTHER PUBLICATIONS

F.S. Chen, et al. "Advanced Planarized Aluminum Metallization Process" Adv. Metallization and Processing for Semicond. Dev. and Circuits II Symp. p. 617–22, 1992.

S. Wolff, et al., Jun. 1991 Proc. 8th Internat. IEEE VLSI Multilevel Interconnect. Conf. "Multilevel Interconnects Using Al CVD" p. 307.

Amazawa et al., Via Plug Process Using Selective CVD Aluminum for Multilevel Interconnection, Dec. 1991, pp. 265–268.

(List continued on next page.)

*Primary Examiner*—Caridad Everhart
*Attorney, Agent, or Firm*—Oliff & Berridge PLC

[57] ABSTRACT

A semiconductor device has a multilevel interconnection structure that includes an insulating interlayer formed on a lower wiring layer, a semiconductor substrate, and at least one via hole. The via plug partially fills the via hole, and the upper surface of the via plug may have a convex shape or a surface of the lower wiring layer at a bottom of the via hole may have a concave shape. Where two via holes are present, one via plug substantially fills the shallowest via hole, and partially fills the deepest via hole. The upper wiring layer may be formed over the via plug to fill a remaining portion of the via hole not filled by the via plug.

33 Claims, 18 Drawing Sheets

OTHER PUBLICATIONS

Hariu et al., The Properties of Al–Cu/Ti Films Sputter Deposited at Elevated Temperatures and High DC Bias, 1989, pp. 210–214.

Park et al., Al–PLAPH (Aluminum–Planarization by Post–Heating) Process for Planarized Double Metal CMOS Applications Jun. 1991, pp. 326–328.

Chen et al., Planarized Aluminum Metallization for Sub–0, $5\mu$m CMOS Technology, 1990, pp. 51–54.

Yamamoto et al., Reliable Tungsten Encapsulated Al–Si Interconnects For Submicron Multilevel Interconnection, 1987, pp. 205–208.

Hiroshi Nishimura et al. Reliable Submicron Vias Using Aluminum Alloy High Temperature Sputter Filling VMIC Conf. (Jun. 11–12, 1991) pp. 170–176.

| Sample No. | Resist process | Cleaning by wet etchant | Plasma etching |
|---|---|---|---|
| 1 | × | × | × |
| 2 | ○ | × | × |
| 3 | ○ | × | ○ |
| 4 | ○ | ○ | × |

○ : Performed

× : Not performed

Fig. 35

| Sample No. | Exposed to air | Underlying metal layer | Substrate temperature while depositing (°C) | | | | | | | | | Annealing temperature after deposition (°C) | | | | | |
|---|---|---|---|---|---|---|---|---|---|---|---|---|---|---|---|---|---|
| | | | 275 | 300 | 325 | 350 | 400 | 425 | 450 | 500 | 375 | 400 | 425 | 450 | 475 | 500 |
| 11 | E | None | × | × | × | × | ◀ | ● | ● | ● | × | × | × | ◀ | ◀ | ● |
| 12 | E | Ti | × | × | × | ◀ | ● | ● | ● | ● | × | × | × | ● | ● | ● |
| 13 | N | None | × | ◀ | ◀ | ◀ | ● | ● | ● | ● | × | ◀ | ◀ | ● | ● | ● |
| 14 | N | Ti | × | △ | △ | ● | ● | ● | ● | ● | × | ◀ | ● | ● | ● | ● |
| 15 | N | TiN/Ti | × | × | × | △ | △ | △ | ○ | ○ | × | × | △ | ○ | ○ | ○ |
| 16 | N | Ti/TiN/T | × | × | × | △ | △ | ○ | ○ | ○ | × | × | △ | △ | ○ | ○ |

E: Exposed to air
N: Not exposed to air

SEMICONDUCTOR DEVICE HAVING A MULTILEVEL INTERCONNECTION STRUCTURE

This application is a Division of application Ser. No. 08/172,717 filed Dec. 27, 1993 now U.S. Pat. No. 5,637,534.

BACKGROUND OF THE INVENTION

1. Field of the Invention

The present invention relates to a method of manufacturing a semiconductor device having a multilevel interconnection structure and, more particularly, a method of burying a conductive metal in a via hole formed in an insulating interlayer to connect wiring lines between layers.

2. Related Background Art

With the recent advance of micropatterning of a semiconductor device, a technology for burying a conductive metal in a via hole (formed in an insulating interlayer) serving as a connecting portion between lower and upper wiring layers is important when a multilevel interconnection structure is formed in the semiconductor device.

For example, as a method of forming a low-resistance buried plug (via plug) in a fine via hole having a diameter of 1.0 $\mu$m or less, the selective Al-CVD (aluminum chemical vapor deposition) method using an organic Al compound as a material is proposed. A method using the selective Al-CVD method is disclosed in U.S. Pat. No. 5,151,305, in which DMAH (dimethylaluminumhydride) and hydrogen are used as materials and Al is deposited not on the surface of an insulating layer but on a semiconductor or conductive material. According to this method, Al is deposited in a via hole formed in the insulating layer, and subsequently, Al is deposited on the entire surface by sputtering method.

However, when the lower wiring layer consists of Al or an Al alloy, it is difficult to ideally perform the selective Al-CVD method. On the other hand, some processes are disclosed in, e.g., Japanese Patent Laid-Open No. 2-132825, which are required to satisfactorily form a via plug by the selective W-CVD method using a $WF_6$ gas as a material even when the lower wiring layer consists of Al or an Al alloy.

In practice, an aluminum oxide (alumina) film is formed on the Al surface exposed to the bottom of the via hole to interfere with formation of a via plug by the selective W-CVD method. For this reason, this example cited discloses that the alumina film must be removed by an Ar plasma process, and that the surface of the insulating interlayer must be activated by the Ar plasma to degrade selectivity. More specifically, the Ar plasma process (removal of the alumina layer activation of the surface of the insulating interlayer) and a halogen plasma process (stabilization of the surface of the insulating interlayer) must be sequentially performed, or two processes must be simultaneously performed in a plasma atmosphere containing a gas mixture of Ar and halogen.

SUMMARY OF THE INVENTION

It is an object of the present invention to provide a method of ideally burying a via hole by the selective Al-CVD method using an organic Al compound as a material when a wiring serving as a lower wiring is formed of a conductive material including Al or an Al alloy.

In order to achieve the above object, according to the present invention, there is provided a method comprising a first step of forming an insulating interlayer on a lower wiring layer comprising a conductive material including Al or an Al alloy formed above a semiconductor substrate, a second step of forming a via hole in the insulating interlayer, a third step of performing plasma etching on a bottom portion of the via hole and a surface of the insulating interlayer in an atmosphere containing a chlorine-based gas as a major component and not containing carbon, which is a process for sufficiently removing an undesirable contamination substance attached to the surface of the insulating interlayer, and the fourth step of forming a via plug comprising a conductive material including Al or an Al alloy in the via hole.

The undesirable contamination includes an alumina film formed on the bottom portion of the via hole and an organic contamination substance attached to the surface of the insulating interlayer.

First of all, the present inventors found that the following characteristics were required as a pretreatment for the selective Al-CVD for burying a via plug in a via hole formed in an insulating interlayer.

① An alumina film formed on the bottom portion of the via hole is sufficiently removed.

② The surface of an insulating interlayer is stabilized and the residual chlorine contents are set to a predetermined value or less.

③ Organic contaminants attached to the surface of the insulating interlayer in a resist process for formation of the via hole are sufficiently removed.

Therefore, the present invention reveals that an atmosphere containing chlorine or a chlorine compound, in more detail, an atmosphere containing $BCl_3$ as a major component is effective to obtain the above characteristics, and proposes an optimal range of process conditions.

When plasma etching is performed in a gas mixture atmosphere including $BCl_3$ and Ar, the flow rate ratio is set to $BCl_3/(BCl_3+Ar)>0.36$.

The preferable ratio is set to $BCl_3/(BCl_3+Ar)>0.63$.

When plasma etching is performed in a gas mixture atmosphere including $BCl_3$ and $Cl_2$, the flow rate ratio is set to $BCl_3/(BCl_3+Cl_2) \geq 0.25$.

The preferable ratio is set to $BCl_3/(BCl_3+Cl_2) \geq 0.75$.

The gas mixture atmosphere may include an inactive gas such as He, etc.

In addition, as an effective method of realizing micropatterning of the semiconductor device and reduction of contact resistance, the present invention proposes the practical size of the via hole (0.8 $\mu$m or less in more detail) formed in the insulating interlayer, and a unique shape of the surface of the lower wiring layer.

The content of chlorine left on the surface of the insulating interlayer by the pretreatment must be a predetermined amount or less. Thus, heating may be performed in addition to plasma etching in the third step, or ultra-violet (UV) light radiation at a predetermined intensity may be performed.

As the structure of the lower wiring layer, an upper layer consisting of a high melting point metal, or a nitride, boride, or oxynitride of the high melting point metal may be formed on a wiring layer (an Al layer) including Al or an Al alloy.

After the via plug is formed in the via hole, the upper wiring layer comprising Al is formed. At this time, as the substrate temperature is 300° C. or higher, the upper portion of the via plug and the deposited Al film flow together, so that the burying property is improved. Alternatively, the Al film is deposited at the substrate temperature of 100° C. or below, and thereafter the Al film is heated at 400° C. or higher, so that the upper portion of the via plug and the deposited Al film flow together and the burying property is improved.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 35 is a table showing the evaluation of substrate temperature dependency in heating for semiconductor devices in which an upper wiring layer is formed in different structure.

DETAILED DESCRIPTION OF THE PREFERRED EMBODIMENTS

An embodiment of the present invention will be described below with reference to FIGS. 1 to 40.

Embodiment 1

FIGS. 1 to 4 are views showing steps in the manufacture of a semiconductor device having a multilevel interconnection structure according to the present invention.

Figure 1:
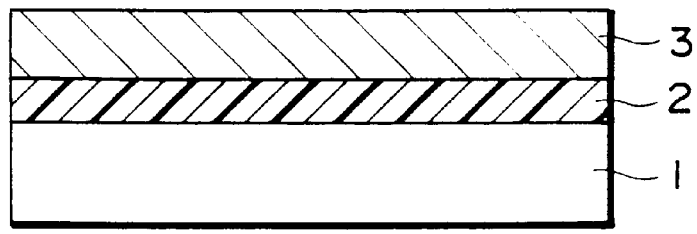
FIGS. 1 to 4 are views showing steps in the manufacture of a semiconductor device having a multilevel interconnection structure according to the present invention (Embodiment 1)

In the present invention, a lower Al wiring layer 2 consisting of an Al-0.5 wt % Cu alloy and having a thickness of 500 nm is formed on a lower device layer 1 constituted by various devices such as an FET formed on a semiconductor substrate in the first step. An $SiO_2$ film having a thickness of 1 µm is formed as an insulating interlayer 3 on the lower Al wiring layer 2 (FIG. 1).

Detailed steps in the formation of the lower Al wiring layer 2 and the insulating interlayer 3 are as follows.

A structure required as a semiconductor device is formed on the substrate, and at the same time, an underlying insulating layer is formed on the surface of the substrate to form the lower device layer 1. An Al alloy is deposited to a thickness of 300 to 800 nm on the underlying insulating layer of the lower device layer by the sputtering method.

The Al alloy is patterned into a predetermined wiring line to form the lower Al wiring layer 2. The wiring line pattern is formed by RIE using a chlorine-based gas after a resist pattern is formed by using an exposure apparatus.

The lower device layer 1 on which the lower Al wiring 2 is formed is covered with the insulating interlayer 3. The insulating interlayer 3 is obtained in the following manner. $SiO_2$ is deposited by the plasma CVD method to form an $SiO_2$ film having a thickness of 300 nm. SOG (spin-on-glass) is coated on this $SiO_2$ film and heating is performed at 400° C. to form an SOG film having a thickness of 300 nm at a flat portion. $SiO_2$ is deposited by the plasma CVD method again to form an $SiO_2$ film having a thickness of 200 nm.

A method of forming the insulating interlayer 3 in a micropatterned LSI having a wiring line width of 0.6 µm or less is as follows. $SiO_2$ is deposited by the plasma CVD method using tetraethoxysilane (to be referred to as TEOS hereinafter) and oxygen as materials to form an $SiO_2$ film having a thickness of 100 nm. Further, $SiO_2$ is deposited on the $SiO_2$ film by the atmospheric pressure CVD method using TEOS and ozone as materials to form an $SiO_2$ film having a thickness of 1.0 $\mu$m. SOG is coated on the $SiO_2$ film to form an SOG film having a thickness of 1.0 $\mu$m, and heating is performed at 400° C. Etchback is then performed to obtain a 400-nm thick $SiO_2$ film on the flat portion. $SiO_2$ is deposited again to a thickness of 400 nm by the plasma CVD method.

Figure 2:
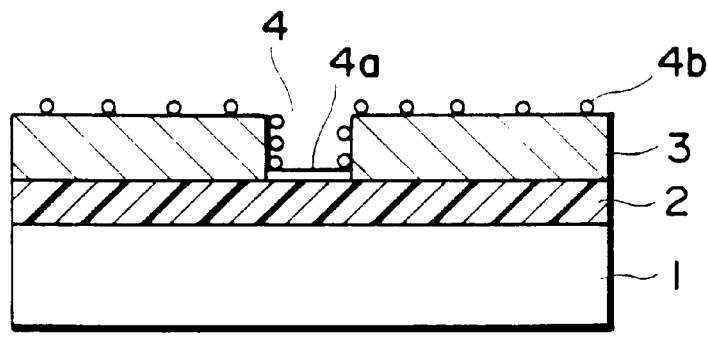

Subsequently, in the second step, a resist pattern is formed on the insulating interlayer 3 by photolithography. A via hole 4 having a diameter of 0.5 $\mu$m is formed in the insulating interlayer 3 by dry etching using a fluorine-based gas mixture. The resist is removed by performing an oxygen plasma process and an organic solvent (cleaning) (FIG. 2). A native oxide film (alumina film) 4a is formed on the surface of the lower Al wiring layer 2 exposed to the bottom of the via hole 4 during dry etching or resist removal and when the lower Al wiring layer 2 is exposed to air. An organic contaminant 4b such as a resist residue is attached to the surface of the insulating interlayer (silicon oxide film) 3.

A via plug is buried in the following procedures by using a film forming apparatus having an etching chamber, a CVD chamber, and a sputtering chamber. Note that the arrangement of this film forming apparatus is disclosed in, e.g., U.S. Pat. No. 5,151,305.

A sample prepared in the above steps is set in a load-lock chamber. The load-lock chamber is evacuated to a pressure of $1\times10^{-7}$ torr (to be referred to as vacuum-evacuation hereinafter). Via a transfer chamber vacuum-evacuated to a pressure of $1\times10^{-8}$ torr, the sample is transferred to the etching chamber vacuum-evacuated to a pressure of $5\times10^{-8}$ torr (third step). This etching chamber has a volume of about 20 l and a function of performing cathode coupled parallel plate reactive ion etching (RIE), and can generate a plasma by radio-frequency (RF) electrical discharge at 13.56 MHz (the area of an electrode plate is 140 $cm^2$ and a distance between electrodes is 7 cm).

A $BCl_3$ gas and an Ar gas are introduced into the etching chamber at flow rates of 80 sccm and 18 sccm respectively. While keeping the total pressure at 0.1 torr, electrical discharge is performed at a power of 50 W (a power density of 0.35 $W/cm^2$) to perform plasma etching for 10 minutes.

The Ar gas is supplied from the rear surface side of the substrate to obtain good thermal-contact between the substrate (its structure is shown in FIG. 2) and the substrate electrode and prevent an increase in surface temperature of the substrate during plasma etching.

The etching chamber is then vacuum-evacuated to a pressure of $1\times10^{-8}$ torr.

In the fourth step, the substrate is transferred to the CVD chamber vacuum-evacuated to a pressure of $1\times10^{-7}$ torr via the transfer chamber. A substrate holder having a heater and a gas nozzle are provided to the CVD chamber. A DMAH gas using an $H_2$ gas as a carrier gas is supplied from the gas nozzle by bubbling (in this apparatus, only $H_2$ gas can be supplied by bypassing the bubbler).

Figure 4:
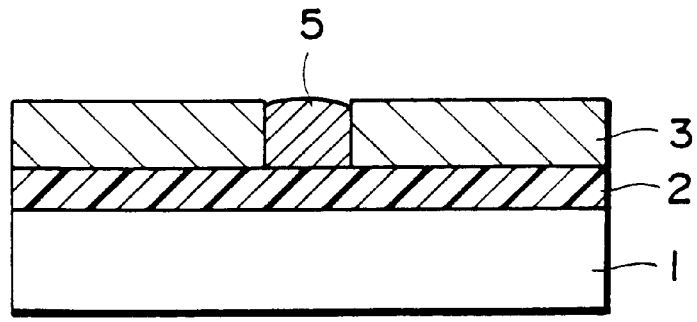

Immediately after the transferred substrate is mounted on the substrate holder heated to 210° C., the $H_2$ gas is supplied to control the internal pressure of the CVD chamber to 2 torr. In this state, the surface temperature of the substrate is kept stable for 10 minutes. Subsequently, DMAH is supplied at a partial pressure of 30 mtorr to perform the selective Al-CVD method for eight minutes, thereby forming a via plug 5 in the substrate (FIG. 4). The CVD chamber is then vacuum-evacuated to a pressure of $1\times10^{-6}$ torr.

Figure 5:
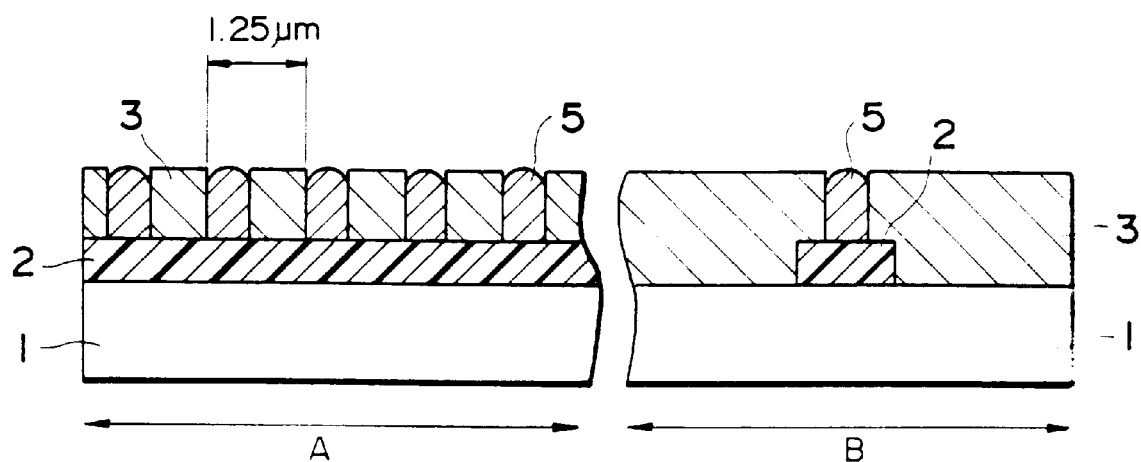
FIG. 5 is a view for explaining an effect of plasma etching (third step) according to the present invention.
Figure 6:
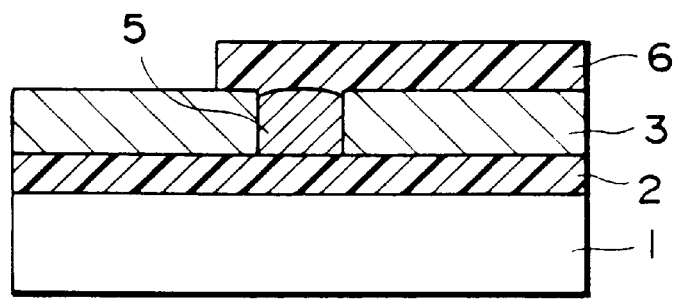
FIG. 6 is a view showing a sectional structure of the semiconductor device according to the present invention.

The result obtained when the substrate at this time is observed with a scanning electron microscope (SEM) is shown in FIG. 5. The sample prepared has a region where the via holes 4 were densely formed at pitches of 1.25 $\mu$m (region indicated by A in FIG. 5) and a region where the via holes 4 are sparsely formed (region indicated by B in FIG. 5). By observing this sample, it was confirmed that the via plugs 5 were formed with good selectivity in both the regions.

The substrate having the Al via plugs 5 satisfactorily formed therein is transferred to the sputtering chamber vacuum-evacuated to a pressure of $1\times10^{-8}$ torr via the transfer chamber. In this sputtering chamber, magnetron sputtering is performed in an Ar gas atmosphere, and an Al film having a thickness of 1.0 $\mu$m is deposited on the substrate by using an Al target. The sputtering chamber is then vacuum-evacuated to a pressure of $1\times10^{-7}$ torr. The resultant substrate is removed from the film forming apparatus via the transfer and load-lock chambers.

Finally, the Al film is patterned into a predetermined shape by using the conventional photolithography and etching techniques. After the resist is removed, heating is performed in a nitrogen atmosphere at 400° C. for 60 minutes, thereby completing a semiconductor device having a sectional shape shown in FIG. 6.

The electrical characteristics of this semiconductor device (FIG. 6) were evaluated with a via chain in which 1000 via holes were connected in series. A very low resistance of 0.25 $\Omega$ was obtained by calculating the resistance per a via hole.

Embodiment 1 exemplified a method of forming the via plug by using DMAH. As an organic Al compound, trimethylaluminum, triisobuthylaluminum, trimethylamine allan, dimethylethylamine allan, or an intermolecular compound of DMAH and trimethylaluminum can also be used. As a material of the via plug, an alloy containing Cu, Si, Ti, or the like can be used. As a material of the insulating interlayer, SiN, SiBN, or the like can be used in addition to $SiO_2$.

Figure 7:
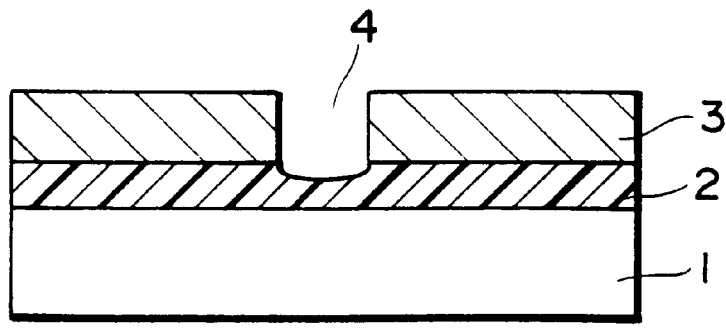
FIGS. 7 and 8 are views for explaining a method of forming a via hole in an insulating interlayer according to the present invention.
Figure 8:
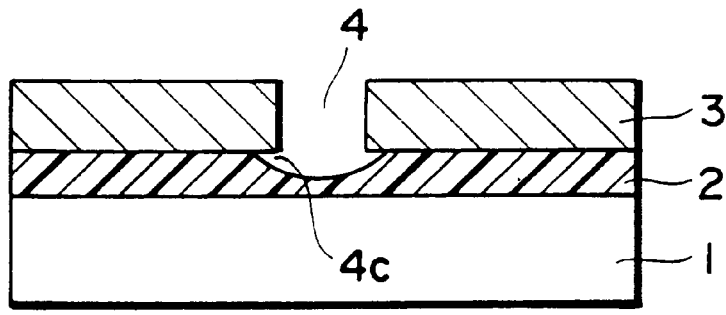

On the other hand, in the third step, when the surface of the insulating interlayer 3 is cleaned under the above plasma etching conditions, the lower Al wiring layer 2 on the bottom of the via hole is isotropically etched to a depth of 150 nm from the surface, as shown in FIG. 7. When the etching time is prolonged, an etching amount is further increased, and an overhang portion 4c larger than the diameter of the via hole 4 is formed in the lower Al wiring layer 2, as shown in FIG. 8. However, even in this case, Al deposition by Al-CVD occurs only on the surface of the lower Al wiring layer 2, so that the via plug 5 is satisfactorily formed without forming a void. In addition, upon radiation of $BCl_x^+$ (x=0 to 3) ions and $Cl_x^+$ (x=1, 2) ions contained in the plasma etching atmosphere, some ions are strongly combined with the surface of the lower Al wiring layer 2 (region located at the bottom portion of the via hole 4). On the other hand, the overhang portion 4c is not irradiated with these ions and is etched only by the chemical effect, so that a cleaner surface can be obtained. Therefore, when the surface of the lower Al wiring layer 2 is etched to form the overhang portion 4c, the contact area between the lower Al wiring layer 2 and the via plug 5 is increased, and the cleanness of the interface between the lower Al wiring layer 2 and the via plug 5 is increased, thereby obtaining better connection characteristics.

Comparative Example 1-1

In order to confirm the necessity of plasma etching in the third step, a substrate having a via hole 4 formed in an insulating interlayer 3 was set in the load-lock chamber of the film forming apparatus, and directly transferred to the CVD chamber via the transfer chamber (that is, the substrate was transferred to the CVD chamber without being processed in the third step of the present invention). The Al-CVD method was performed under the same conditions as in Embodiment 1. The substrate was removed from the apparatus upon completion of CVD, and observed with an SEM.

Figures 9, 10:
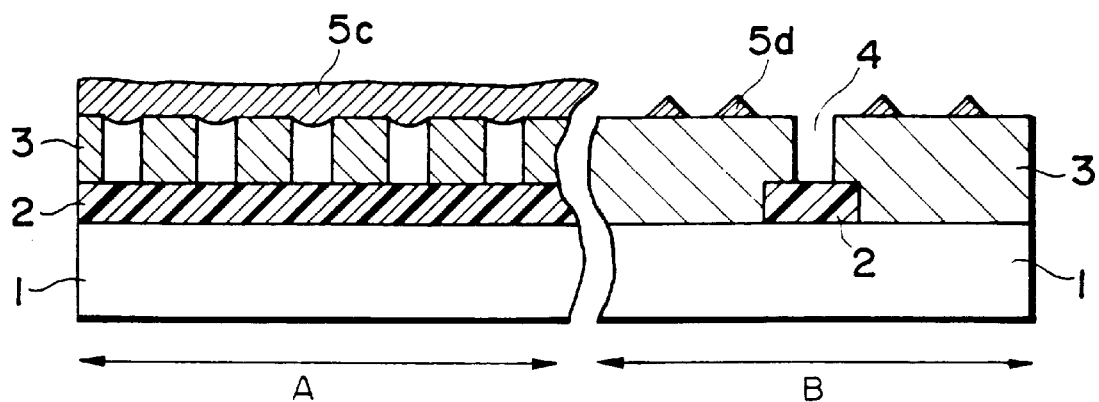
FIG. 9 is a view showing results of comparative experiments for comparison with the effect of the present invention.
FIG. 10 is a table summarizing experiment examples actually conducted to examine causes for determining selectivity of the Al-CVD (for forming a via plug) of the present invention.

In this case, as shown in FIG. 9, in a region A where the via holes 4a were densely formed, Al was not observed to be deposited from the surface of a lower Al wiring layer 2 at the bottom of the via hole 4 because, during RIE and resist removal performed to form the via hole 4, and when the surface of the substrate was exposed to air, an alumina layer 4a was formed on the surface of the lower Al wiring layer 2 to interfere with Al deposition by CVD. Deposition of film-like Al 5c was observed on the insulating interlayer 3.

To the contrary, deposition of particle-like Al 5d was observed in an area B.

In order to clarify the factors for determining selectivity of Al-CVD method, substrates (samples of Nos. 1 to 4) having p-$SiO_2$ ($SiO_2$ deposited by plasma CVD) film deposited (no via hole was formed) were variously processed, Al-CVD was then performed, and the presence/absence of deposition was examined (FIG. 10). The objective processes were a resist process, cleaning by a wet etchant, and plasma etching.

Comparative examples are as follows.

Comparative Example 1-2 (sample No. 1)

Al was deposited without performing any of the resist process, cleaning by a wet etchant, and plasma etching.

Comparative Example 1-3 (sample No. 2)

Of the three processes, only the resist process was performed.

Note that this resist process was performed in the order of resist coating, development, RIE (under the same conditions as in formation of a via hole 4), and an oxygen plasma process and organic solvent cleaning.

Comparative Example 1-4 (sample No. 3)

Of the three processes, the resist process and plasma etching were performed.

Note that this plasma etching was performed under the same conditions as in Embodiment 1 described above.
Comparative Example 1-5 (sample No. 4)

Of the three processes, the resist process and cleaning by a wet etchant were performed.

Note that HF+$NH_4F$ was used as a wet etchant.

Data about Comparative Examples were summarized. No Al deposition was observed in the samples of Nos. 1, 3, and 4. Deposition of particle-like Al was observed in sample No. 2.

From the result of Comparative Example 1-2, it was found that the p-$SiO_2$ film itself did not inhibit to ensure selectivity but some contaminant attached to the surface of the p-$SiO_2$ film did. In fact, when the flatness of the surface of the p-$SiO_2$ film was examined with an AFM (atomic force microscopy), only fine three-dimensional patterns having a vertical size of 15 $nm^{p-p}$ or less were present in the sample of No. 1. However, in the sample of No. 2, large three-dimensional patterns having a vertical size of 30 $nm^{p-p}$ were present and some contaminant was confirmed to be attached. The sample of No. 3 restored almost the same state as in the sample of No. 1, and the change in thickness of the p-$SiO_2$ film measured by an optical method was only about 1.2 nm, so that it was found that only the contaminant attached to the surface was removed.

From comparison of the samples of Nos. 1 and 2, it was found that this contaminant was attached during the resist process. From comparison of the samples of Nos. 3 and 4, it was found that this contaminant could be sufficiently removed by plasma etching using a $BCl_3$+Ar gas, or wet etching using an HF+$NH_4F$ solution.

In order to identify this contaminant, the surface states in the samples of Nos. 2 and 3 before Al-CVD method were examined.

When Si—O bonded states were examined by ESCA (electron spectroscopy for chemical analysis), significant differences were not observed. When impurity concentrations of the surfaces were examined by ESCA, the sample of No. 2 was found to have C. (carbon) about twice that of the sample of No. 3. The same results were obtained from observation with an AES (Auger electron spectroscopy). When metal contaminant (Na, K, Fe, Zu, Cu, and Ni) contents on the surfaces were examined with an atomic absorption spectrometry, remarkable differences were not observed in the samples of Nos. 1 and 2. On the other hand, the Fe, Cu, Ni contents of the sample of No. 3 were found to be about twice those of the sample of No. 2.

From these results, the following conclusions can be obtained.

(1) Activation caused due to generation of free radicals (Si atoms not combined with O) on the surface of the insulating interlayer 3 is not the main cause for determining selectivity of Al-CVD method.

(2) Organic contaminants attached to the surface of the insulating interlayer 3 are the main cause of selectivity degradation.

(3) Metal contaminants are not the main cause for determining selectivity.

The phenomenon that deposition of film-like Al 5c was observed on the region A can be understood in consideration of the high organic contaminant contents at that portion. This can be assumed because the resist side wall in the via hole 4 is exposed to a plasma containing fluorine during RIE performed to form the via hole 4 and changes into a state in which the resist is hardly removed.

From the above examinations, it is apparent that plasma etching using the $BCl_3$+Ar gas has an effect for removing the alumina layer on the surface of the lower Al wiring layer 2 and the organic contaminants attached to the surface of the insulating interlayer 3 during resist process. This plasma etching is effectively performed as a pretreatment for forming of the via plug.

From the result of Comparative Example 1-5, it is found that the organic contaminants can also be sufficiently removed by a wet etchant (HF+$NH_4F$ solution) as a wet cleaning solution. However, this method cannot be used when the surface of the lower Al wiring layer 2 is exposed to the bottom of the via hole, because the lower Al wiring layer 2 itself is exposed. Even if the organic contaminants are removed by wet etching, an alumina film is formed on the surface of the lower Al wiring layer 2 when the surface of the sample is exposed to air. For this reason, a process for removing the alumina film is required. In addition, the via hole becomes larger in wet etching, so that this method is disadvantageous to micropatterning.

Experiment 1

In order to clarify the range of plasma etching conditions in the third step for obtaining satisfactory results, a substrate as in Example 1 (substrate having a via hole 4 formed in an insulating interlayer 3) was plasma-etched such that a flow rate ratio $BCl_3/(BCl_3+Ar)$ was changed, and was then subjected to Al-CVD method. The deposited state of a via plug 5 from the surface of a lower Al wiring layer 2, and the presence/absence of deposition of Al on the insulating interlayer 3 were examined.

Figure 11:
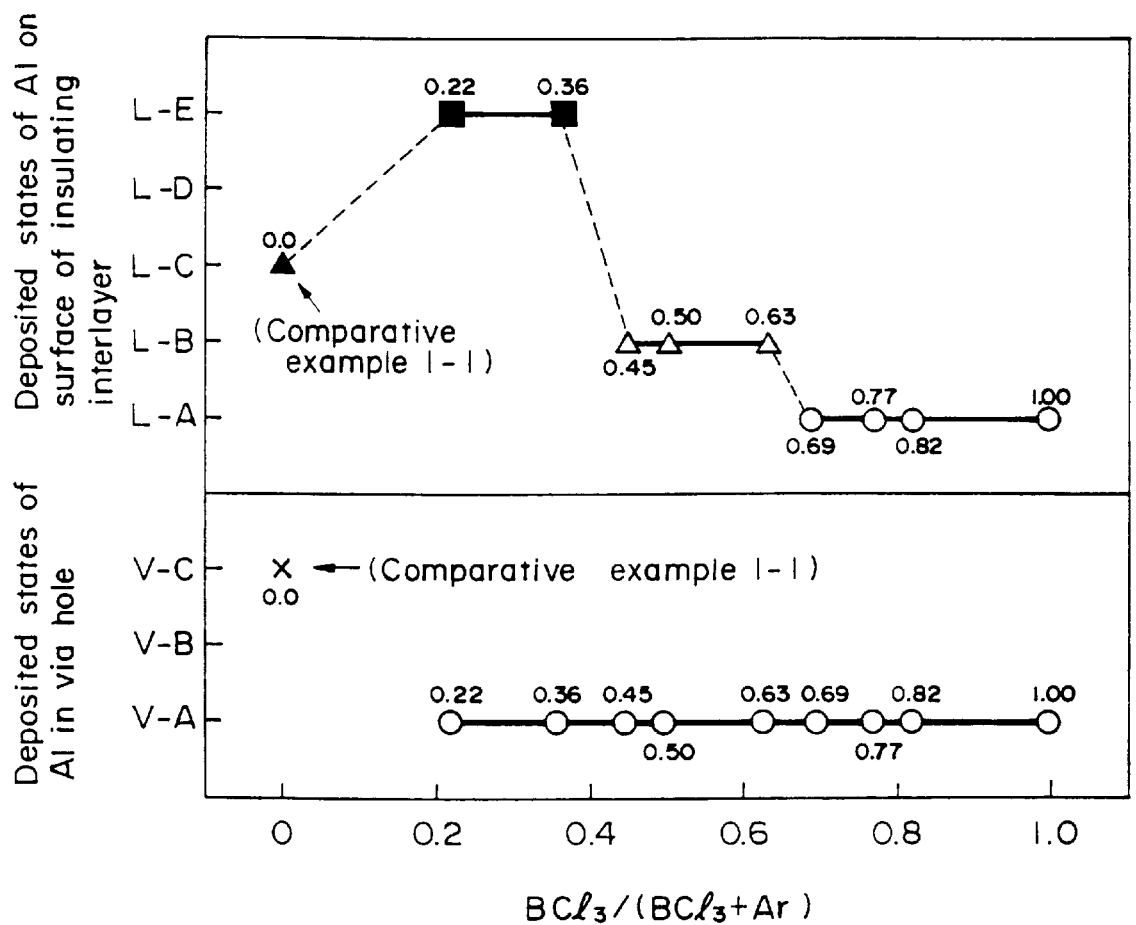
FIG. 11 is a graph showing the results of experiments conducted to clarify the range of plasma etching conditions in the present invention when a ($BCl_3$+Ar) plasma was utilized.

FIG. 11 shows results obtained such that Al-CVD was performed after plasma etching was performed in an atmosphere in which an Ar flow rate was kept at 18 sccm while a $BCl_3$ flow rate was changed, and a flow rate ratio $BCl_3/(BCl_3+Ar)$ was changed within the range of 0 to 0.82, and in an atmosphere containing only $BCl_3$ at a flow rate of 80 sccm ($BCl_3/(BCl_3+Ar)=1$). Note that the total pressure was in the range of 0.05 to 0.1 torr, and the RF power and the etching time were the same as those in Embodiment 1. A result (Comparative Example 1-1) obtained without performing plasma etching is also shown.

The deposited states of Al in the via hole 4 were classified into the following three states and evaluated.

V-A: Al was deposited from the surface of the lower Al wiring layer 2 on the bottom of the via hole 4 to form the via plug 5.

V-B: The via plugs 5 were formed in part of via holes 4.

V-C: No via plug 5 was formed in the via hole 4.

When an atmosphere containing only Ar (flow rate ratio= 0) was used, the same result as in Comparative Example 1-1 without plasma etching was obtained, and no Al deposition was observed at all. Except for this condition, uniform Al deposition was observed in all via holes 4. At least within the range of the experiment conditions, it is found that an alumina layer formed on the surface of the lower Al wiring layer 2 can be sufficiently removed as far as plasma etching is performed in an atmosphere containing $BCl_3$.

On the other hand, Al deposition on the insulating interlayer 3 was evaluated with reference to the surface conditions shown in FIGS. 12 to 16 (note that this is the evaluation of the surface of the insulating interlayer 3 when the via plug is formed in the via hole 4).

Figure 12:
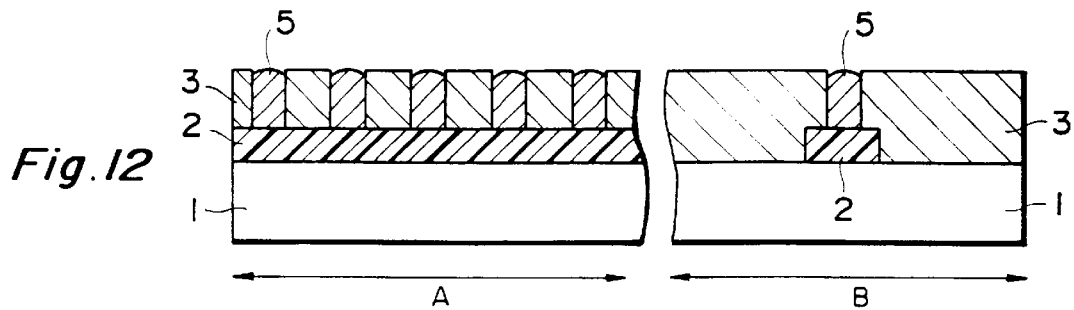
FIGS. 12 to 16 are views showing surface states on the insulating interlayers under the conditions shown in FIG. 11.

L-A: As shown in FIG. 12, good selectivity was obtained in both a region A where the via holes 4 were densely formed at pitches of 1.25 μm and a region B except for the region A, and Al deposition was not confirmed on the surface of the insulating interlayer 3 (indicated by ○ in FIG. 11).

Figure 13:
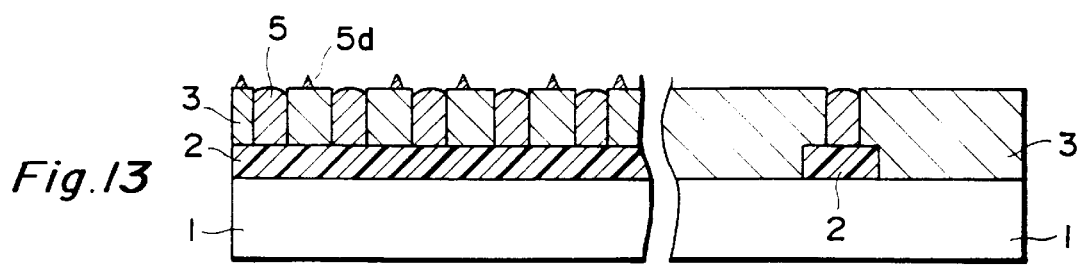

L-B: As shown in FIG. 13, selectivity was slightly degraded. Al deposition was not confirmed in the region B. and deposition of particle-like Al 5d was confirmed in the region A (indicated by Δ in FIG. 11).

Figure 14:
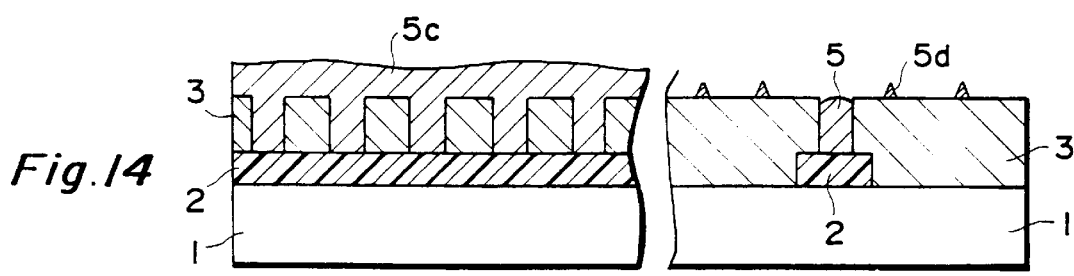

L-C: As shown in FIG. 14, selectivity was further degraded. Deposition of the particle-like Al was confirmed in the region B, and deposition of film-like Al 5c was confirmed in the region A (indicated by ▲ in FIG. 11).

Figure 15:
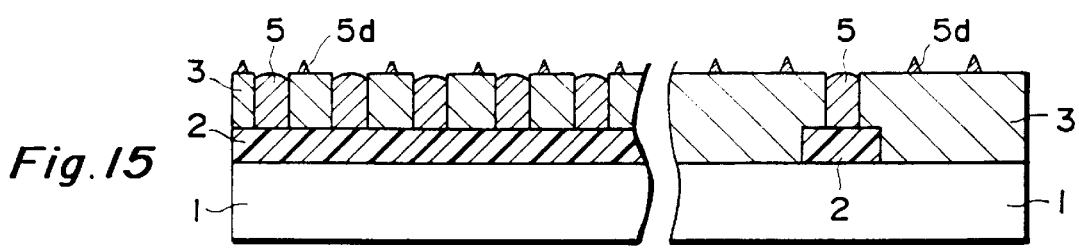

L-D: As shown in FIG. 15, uniform deposition of the particle-like Al 5d was confirmed in both the regions A and B (indicated by □ in FIG. 11).

Figure 16:
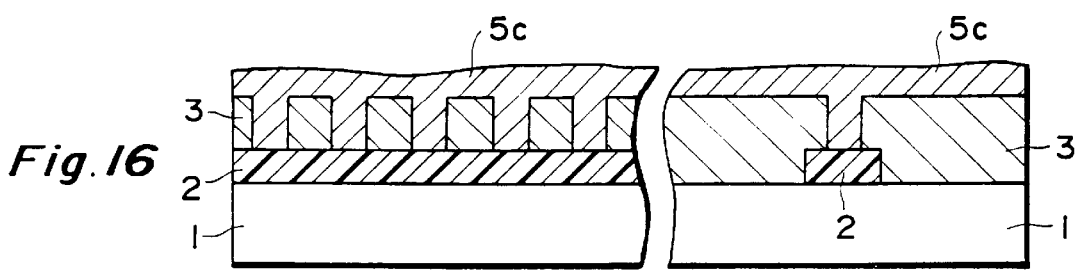

L-E: As shown in FIG. 16, deposition of the film-like Al 5c was confirmed in both the regions A and B (indicated by ■ in FIG. 11).

The surface condition L-C is the same condition as in the case without plasma etching (Comparative Example 1-1), and no effect for removing organic contaminants (4b in FIG. 2) on the surface of the insulating interlayer 3 is observed. In the surface condition L-B, some effect for removing the organic contaminants is observed but it is inferior to that of the surface condition L-A. In the surface condition L-D, the effect for removing the organic contaminants is obtained to some degree (or sufficiently). However, due to plasma etching, the surface condition of the insulating interlayer 3 is changed to easily cause Al deposition. In the surface condition L-E, due to plasma etching, the surface condition of the insulating interlayer 3 is changed to more easily cause Al deposition as compared to the case without plasma etching (in the condition L-E, the degree of effect for removing the organic contaminants on the surface of the insulating interlayer 3 is not clarified).

On the other hand, the following facts are found from FIG. 11:

I) At a flow rate ratio $BCl_3/(BCl_3+Ar)$ of 0.69 or more, good selectivity can be obtained.

II) When the flow rate ratio $BCl_3/(BCl_3+Ar)$ is within the range of 0.45 to 0.63, selectivity is improved as compared to the case without plasma etching. Satisfactory selectivity can be obtained except for the region A, and deposition of the particle-like Al 5d is observed in the region A.

III) At the flow rate ratio $BCl_3/(BCl_3+Ar)$ of 0.36 or less, deposition of the film-like Al 5c is observed on the entire surface of the insulating interlayer 3.

IV) When the flow rate ratio $BCl_3/(BCl_3+Ar)$ is 0, the same result as in the case without plasma etching can be obtained.

From the above description, except for the flow rate ratio of 0, in plasma etching in an atmosphere containing $BCl_3$ as a major component, selectivity is degraded as the flow rate ratio $BCl_3/(BCl_3+Ar)$ is decreased. In particular, at the flow rate of 0.36 or less, selectivity is degraded. Therefore, it is found that a plasma etching condition for obtaining satisfactory selectivity is preferably the flow rate ratio $BCl_3/(BCl_3+Ar)$ of more than 0.36, and more preferably the flow rate ratio of more than 0.63.

On the other hand, removal of the alumina layer 4a (FIG. 2) is considered to progress upon radiation of ions under the presence of $BCl_x$ (x=0 to 3) radicals having a reduction effect. The $BCl_x$ radical concentration is considered to decrease as the flow rate ratio is decreased (because the $BCl_3$ gas concentration is reduced). However, when the flow rate ratio is within the range of 0.22 to 1.0, the $BCl_x$ radical concentration is sufficiently high. The etching rate for the alumina film can be assumed to be determined in accordance with this ion concentration. On the other hand, when the flow rate ratio is 0, no $BCl_x$ radical is present, so that it can be assumed that the etching rate for the alumina film is extremely decreased.

The phenomenon that deposition of the particle-like Al 5d is confirmed at the high-density portion (region A) of the via holes 4 when the flow rate ratio $BCl_3/(BCl_3+Ar)$ is within the range of 0.45 to 0.63 can be understood by considering that removal of the organic contaminants is determined mainly by the $BCl_x$ and $Cl_x$ (x=1, 2) radical concentrations. Therefore, it can be assumed that especially in the high-density portion of the via holes 4 where the organic contaminant concentration is high, the residual content of the organic contaminants increase to cause deposition of the particle-like Al 5d.

Experiment 2

In order to clarify the causes of selectivity degradation by plasma etching in an ($BCl_3+Ar$) atmosphere having a flow rate ratio $BCl_3/(BCl_3+Ar)$ of 0.36 or less, analysis of Si—O bonded states (bonded states on the surfaces of insulating interlayers 3) of the substrates plasma-etched at flow rate ratios of 0.36 and 0.69 was performed with ESCA, and residual chlorine contents of these substrates were measured with an ion chromatography.

Significant differences in bonded states on the surfaces of the insulating interlayers 3 were not observed. The residual chlorine contents were 44 ng/cm$^2$ for the flow rate ratio of 0.69 and 72 ng/cm$^2$ for the flow rate ratio of 0.36 (the latter case had the residual chlorine content about 1.6 times the former case). The residual chlorine content is a total amount of chlorine left in the forms of chlorine molecules and a chlorine compound. In order to evaluate the surface states on the insulating interlayers 3 immediately before the start of Al-CVD, the measurement of the residual chlorine contents was performed using the substrates which were transferred to a CVD chamber after the plasma etching, kept heated in the H$_2$ gas atmosphere at 210° C. for 10 minutes, and removed from the CVD chamber.

Residual chlorine contents of substrates plasma-etched under other conditions were also evaluated, and deposition of film-like Al 5c on the entire surface of each insulating interlayer 3 was confirmed if the residual chlorine content exceeded about 60 ng/cm$^2$. It was assumed that decomposition of the DMAH was accelerated in the presence of chlorine in a predetermined amount or more on the surface of the insulating interlayer 3 and that Al was deposited on the surface of the insulating interlayer 3.

As described above, the experiment was conducted to clarify the cause for increasing the residual chlorine content at a low flow rate ratio BCl$_3$/(BCl$_3$+Ar).

First of all, the residual chlorine content of a sample removed immediately after plasma etching under the conditions of Embodiment 1 (FIG. 3) was measured. A very high residual chlorine content almost four times that obtained in heating in a hydrogen atmosphere was obtained. In addition, the residual chlorine content measured in a sample obtained by Ar plasma etching upon the above plasma etching was 130 ng/cm$^2$ (about three times that in Embodiment 1). In this Ar plasma etching, the Ar flow rate was 18 sccm, the total pressure was 0.05 torr, the power was 50 W, and the etching time was 10 minutes.

Judging from these results, chlorine or a chlorine compound attached to the surface of the insulating interlayer 3 in the forms of molecules or radicals during plasma etching can be assumed to be eliminated upon heating the substrate in an H$_2$ atmosphere. However, chlorine or a chlorine compound strongly combined with the surface of the insulating interlayer 3 upon bombardment of chlorine ions accelerated by an electric field (or chlorine or a chlorine compound attached in the form of molecules or radicals and, then, changed into a strong bonded state upon bombardment of other ions) is assumed to be left on the insulating interlayer 3 without being eliminated.

This phenomenon can be considered as follows. When the flow rate ratio is decreased, the Ar gas concentration is increased to cause an increase in Ar$^+$ ion concentration. Ar$^+$ ions are bombarded on the chlorine or a chlorine compound attached to the surface of the insulating interlayer 3 has a higher probability for changing the chlorine or chlorine compound into a strong bonded state upon bombardment of Ar$^+$ ions. The chlorine or chlorine compound is not eliminated even in heating in the CVD chamber and left on the surface. A bias voltage applied to a sample electrode during plasma generation was 55 V for the flow rate ratio of 0.82, while a bias voltage was 100 V for the flow rate ratio of 0.36. The bias voltage was confirmed to be monotonically increased with a decrease in flow rate ratio. An increase in ion energy with an increase in this bias voltage can be assumed to be one of the causes for increasing the probability for changing the chlorine or chlorine compound into a strong bonded state.

If an inert gas, e.g., He, having a molecular weight smaller than that of Ar is used as a substrate cooling gas, this problem may be minimized.

Experiment 3

Figure 3:
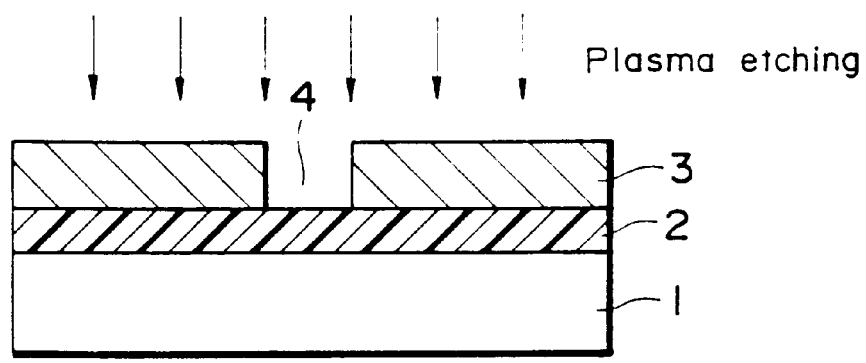

An excessive residual chlorine content also causes corrosion of an upper Al wiring layer. No defects were confirmed in the experiment under the conditions of Embodiment 1 (FIG. 3). However, a residual chlorine content must be further decreased depending on the application environment of a semiconductor device. For this purpose, the following experiment was conducted.

A sample obtained such that plasma etching was performed under the same conditions as in Embodiment 1, and then the substrate was transferred to the CVD chamber and heated in an H$_2$ atmosphere at 400° C. for 10 minutes was used. As a result, the residual chlorine content of the sample was decreased to about 65% of that in Embodiment 1. It is effective to perform heating at a temperature higher than an Al-CVD temperature to reduce the residual chlorine content. Even if the heating temperature was shortened to one minute, the residual chlorine content was reduced to 80% of that in Embodiment 1.

In the heating apparatus used in this experiment, the substrate temperature was not increased to the predetermined temperature 400° C. within one minute, so that the residual chlorine content was reduced to only 80%. If an apparatus capable of heating a substrate to a predetermined temperature within a shorter period of time is used, the heating effect can be enhanced within a shorter period of time, as a matter of course.

Although a higher heating temperature is effective, the upper limit of the heating temperature is about 500° C. to prevent degradation of a lower Al wiring layer 2.

The most effective heating atmosphere is an H$_2$ atmosphere having an effect for eliminating Cl in the form of HCl. However, an inert gas such as N$_2$, Ar, or He can be used. Although this heating can also be performed in a vacuum atmosphere, the partial pressures of O$_2$ and H$_2$O in the vacuum atmosphere must be kept sufficiently low.

Ultra-violet (UV) light was radiated from a low-pressure mercury lamp to a substrate kept heated to 400° C. The intensity of the UV light was 50 mW/cm$^2$. The residual chlorine content was reduced to 1/11 of that in Embodiment 1 by UV heating for 3 minutes. In addition, UV radiation at room temperature was also attempted, but the residual chlorine content was reduced to only 80%. This process can also be performed in the CVD chamber. However, it is more effective to obtain an enhanced chlorine elimination effect when a special process chamber is arranged.

Gas candidates used in plasma etching are Cl$_2$, SiCl$_4$, CCl$_4$ BBr$_3$, and HBr generally used in etching an Al alloy film (wiring metal) in addition to BCl$_3$ so as to remove an alumina film 4a (FIG. 2) formed on the surface of the lower Al wiring layer 2. It is also necessary for producing Cl radicals effective for removing an organic contamination substance 4b (FIG. 2) present on the surface of the insulating interlayer 3. BBr$_3$ or HBr not containing Cl atoms, or C-containing CCl$_4$ which causes deposition is inappropriate.

Experiment 4

In order to clarify the range of plasma etching conditions for obtaining excellent results, a substrate as in Embodiment 1 was plasma-etched such that part of $BCl_3$ was replaced with $Cl_2$, and was then subjected to Al-CVD method. The deposited state of a via plug 5 from the surface of a lower Al wiring layer 2, and the presence/absence of deposition of Al on an insulating interlayer 3 were examined. Note that the evaluation reference was the same as in Experiment 2.

Figure 17:
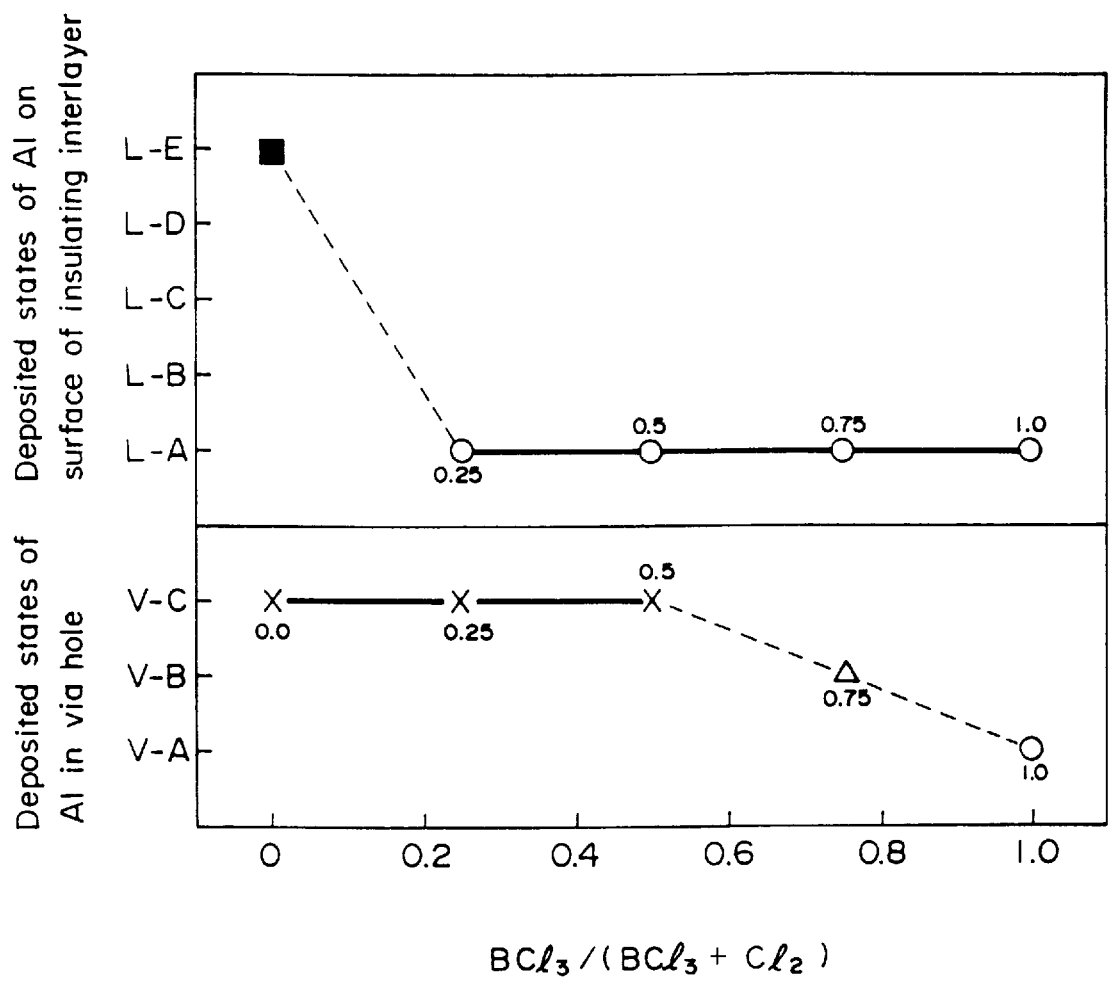
FIG. 17 is a graph showing the results of experiments conducted to clarify the range of plasma etching conditions in the present invention when a ($BCl_3$+$Cl_2$) plasma was utilized.

FIG. 17 shows results obtained such that a $Cl_2$ flow rate was changed at an Ar flow rate of 18 sccm and a total ($BCl_3+Cl_2$) flow rate of 80 sccm, and a flow rate ratio $BCl_3/(BCl_3+Cl_2)$ of $BCl_3$ in the total halogen gas was changed within the range of 0 to 1 to perform plasma etching, and that Al-CVD was then performed to form the via plug 5. The total pressure, the RF power, and the etching time were the same as those in Embodiment 1. A result (Comparative Example 1-1) obtained without performing plasma etching is also shown.

Al deposition in a via hole 4 was confirmed to form the via plug 5 in part of the via hole 4 when the flow rate ratio $BCl_3/(BCl_3+Cl_2)$ was 0.75. However, formation of the via plug 5 was not confirmed at all when the flow rate ratio was 0.5 or less due to the following reason. A reaction for reducing the $BCl_x$ radical concentration in the plasma become dominant by addition of $Cl_2$ in addition to a decrease in $BCl_3$ gas concentration. The $BCl_x$ radical concentration effective to reduce an alumina layer 4a (FIG. 2) is decreased, and the etching rate for the alumina film is decreased. The etching rate for the alumina film can be increased at a higher ion energy or an apparatus having a higher acceleration voltage. However, an alumina reduction effect of the $BCl_x$ radicals is preferably utilized in a gas atmosphere containing at least $BCl_3$ to increase the etching rate.

$CCl_4$, $SiCl_4$, $BBr_3$, and the like are known as gases for effectively removing an alumina layer in addition to $BCl_3$. However, any gas except for $BCl_3$ has a high possibility of producing a deposit. Therefore, $BCl_3$ is most preferable to obtain an insulating interlayer 3 having a clean surface and good selectivity.

As the first process, it is possible to remove organic contaminants present on the surface of the insulating interlayer in a gas mixture atmosphere of $BCl_3+Cl_2$. In the second process, the alumina film can be removed in a gas atmosphere containing $BCl_3$ as a major component. When a $Cl_2$ gas is contained in an atmosphere, a $Cl_x$ radical concentration effective for removing the organic contaminants can be increased, and an insulating interlayer 3 having a cleaner surface can be obtained.

The following facts are found in Al deposition on the insulating interlayer 3.

I) Good selectivity can be obtained at a flow rate ratio of 0.25 or more.

II) Film-like Al 5c deposition on the entire surface of the insulating interlayer 3 can be confirmed at a flow rate ratio of 0.

In order to obtain good selectivity, a gas flow rate ratio of $BCl_3$ in the entire halogen gas is preferably set to 0.25 or more. Since good selectivity can be obtained at the flow rate ratio of 0.25 or more, both $Cl_x$ and $BCl_x$ radicals perhaps are effective to remove the organic contaminants. On the other hand, when the flow rate ratio is 0, degradation of selectivity is found to be caused by the residual chlorine present on the surface of the insulating interlayer 3 because the residual chlorine contents for the flow rate ratios of 0.5 and 0 were measured to be 40 and 67 $ng/cm^2$ (it is assumed that the concentration of ions bombarded on the surface of the insulating interlayer 3 and strongly combined is increased in a plasma not containing $BCl_3$).

Embodiment 1 and the like exemplify plasma etching using a parallel flat plate type apparatus. However, the present invention is not limited to an apparatus of this type. For example, if an ECR (Electron Cyclotron Resonance) type apparatus, TCP (Transformer Coupled Plasma) type apparatus, an ICP (Inductive Coupled Plasma) type apparatus or the like, which can control ion energy independently of a plasma density with an RF bias voltage is used, conditions for satisfying both ion energy for satisfactorily removing an alumina layer and preventing an increase in chlorine or a chlorine compound strongly combined to the surface of the insulating interlayer 3 and a high Cl radical density required to remove the organic contaminants can be easily set. As the first process, the alumina film can be removed at a relatively high ion energy. In the second process, the organic contaminants may be then removed at a low ion energy. The first and second processes may be reversed. In the former case, a lower Al wiring layer 2 on the bottom of a via hole 4 is isotopically etched in the second process, and the contact resistance between the lower Al wiring layer 2 and the Al via plug can be further reduced. The latter case is effective when the thickness of a lower Al wiring layer 2 is small and an over-etching amount must be controlled.

Embodiment 2

Figure 18:
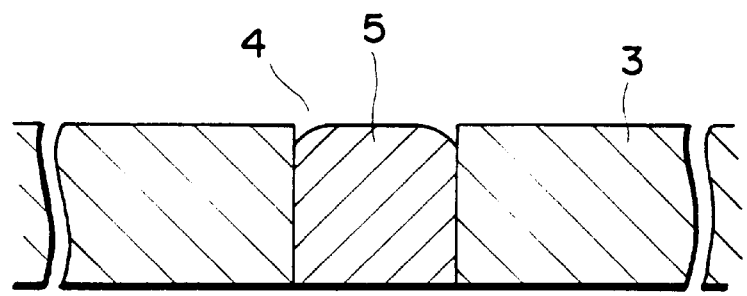
FIGS. 18 and 19 are views showing the results of experiments conducted to clarify the optimal diameter of the via hole (Embodiment 2)
Figure 19:
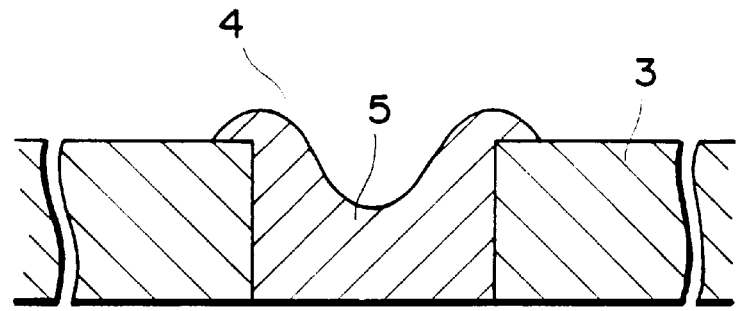
Figure 20:
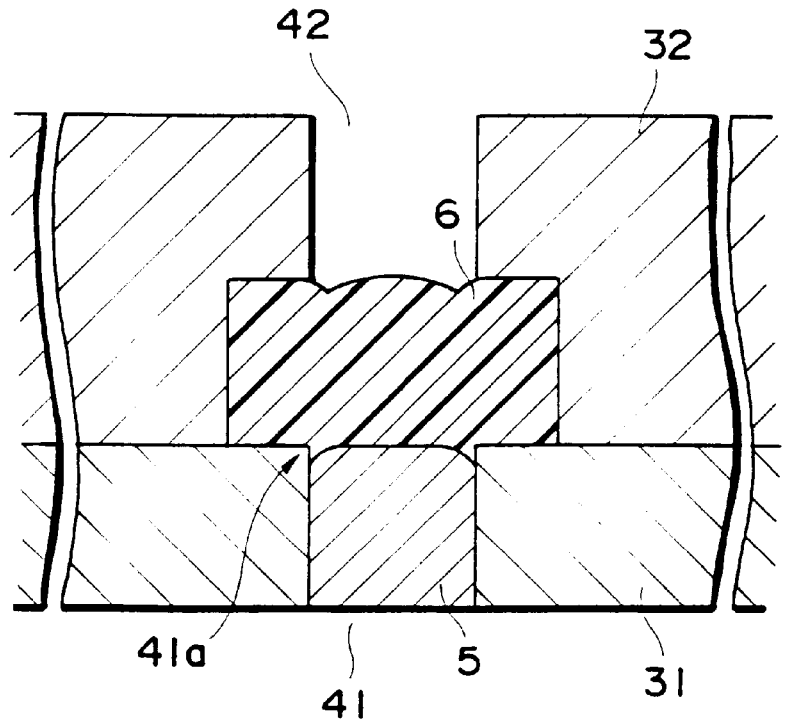
FIGS. 20 and 21 are views showing the results of experiments in which via holes having different diameters were formed to form multilevel interconnection structures.
Figure 21:
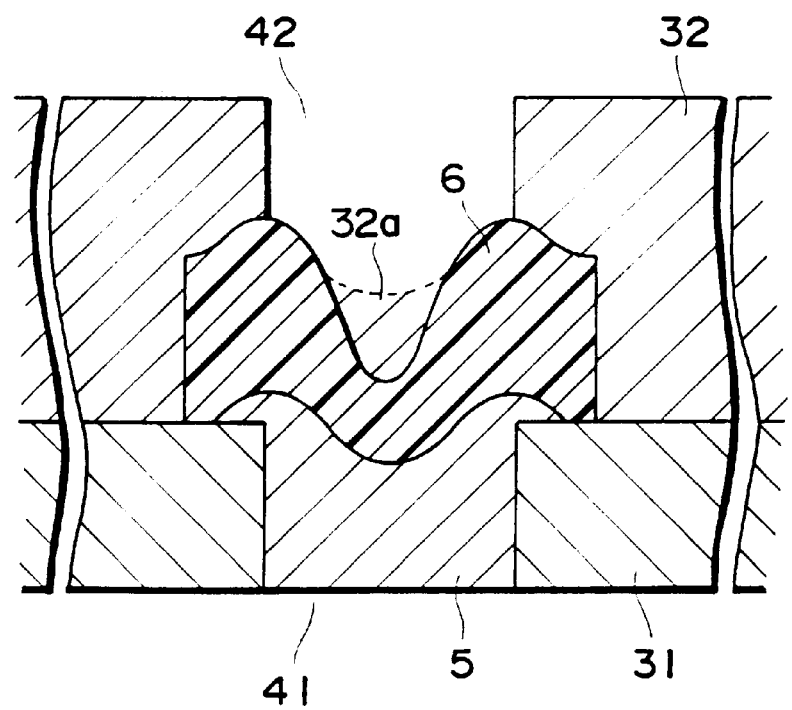

A via plug was formed in a substrate having a via hole 4 having a size (diameter) in the range of 0.3 to 2.0 μm under the same conditions as in Embodiment 1. The shape of this via plug 5 was observed. Although a photomask used for forming the via hole 4 had a square shape, the actually formed via hole 4 had a circular shape of 0.8 μm or less due to the limitation of photolithographic resolution. The sectional shape of the resultant via plug 5 was observed with an SEM. FIGS. 18 and 19 show typical shapes of the via plug 5. FIGS. 20 and 21 show sectional shapes of semiconductor devices having multilevel interconnection structures using these via holes 4, respectively. In particular, each of FIGS. 20 and 21 shows the section of the multilevel interconnection structure that a via plug 5 was formed in a first via hole 41 formed in a first insulating interlayer 31 shown in FIG. 20 or 21, an Al film for forming an upper Al wiring layer 6 (this upper Al wiring layer 6 serves as a lower Al wiring layer when viewed from the second via hole 42) was deposited under the same conditions as in Embodiment 1, the Al film was patterned into a desired shape to form the upper Al wiring layer, a second insulating interlayer 32 was formed on this upper Al wiring layer 6, and a second via hole 42 having the same size as that of the first via hole 41 was formed.

FIG. 20 shows the sectional shape when the diameter of the via hole 4 was set to 0.8 μm. The central portion of the via plug 5 formed in this via hole 4 protruded. When the multilevel interconnection structure was formed using the via hole 4 having this size, an undulation was formed on the surface of the upper Al wiring layer 6 in the presence of a groove 41a formed between the side wall of the first via hole 41 and the via plug 5. Even if an alignment margin between the first via hole 41 and the mask pattern of the upper Al wiring layer 6 was reduced to 0.3 μm, the upper Al wiring layer 6 could be formed without any problem. In addition, when a second via hole 42 for connecting the upper wiring layer 6 to the third wiring layer (not shown) was formed immediately above a first via hole 41, a high yield could be obtained.

FIG. 21 shows the sectional shape when the diameter of the via hole 4 was set to 1.2 μm. The central portion of the via plug 5 formed in this via hole was recessed, and the via plug 5 overflowed from the via hole 4 onto the insulating interlayer 3. When the multilevel interconnection structure was manufactured using the via hole 4 having this size, the thickness of the upper Al wiring layer 6 was reduced in correspondence with the recessed central portion of the via plug 5 formed in the first via hole 41 to form a large recess on its surface. Projections were formed around the first via hole 41 in correspondence with the overflow onto the surface of the first insulating interlayer 31.

The thin Al film for the upper Al wiring layer 6 causes degradation of reliability. The thickness of a resist coated to form the upper Al wiring layer 6 becomes nonuniform due to the large undulation on the surface of the Al film. The nonuniform thickness of the resist leads to variations in exposure sensitivity. For this reason, unless the alignment margin between the first via hole 41 and the mask for forming the upper Al wiring layer 6 is set to 0.6 μm or more and the mask end is sufficiently away from the first via hole 41, defects are formed in the upper Al wiring layer 6. In addition, when the second via hole 42 for connecting the upper wiring layer 6 to the third wiring layer is formed immediately above the first via hole 41, the thickness of the second insulating interlayer 32 is increased due to the recessed central portion of the upper Al wiring layer 6, thereby the second insulating interlayer 32a is left at the recessed central portion even if the via hole 42 for etching is formed. As a result, decreasing the contact area and the yield. Therefore, the first and second via holes 41 and 42 must be spaced apart from each other by a distance of 1.4 μm between their centers. Otherwise, troubles against micropatterning may occur.

As described above, when the diameter of the via hole 4 is 1.2 μm, as compared with the 0.8 μm diameter via hole, a large difference in the degree of integration than a difference between diameters of these via holes 4 occurs. Therefore, in order to increase the degree of integration, as shown in FIG. 20, the size of the via hole 4 must be limited within the range in which the via plug 5 having the protruding central portion can be formed.

Figure 22:
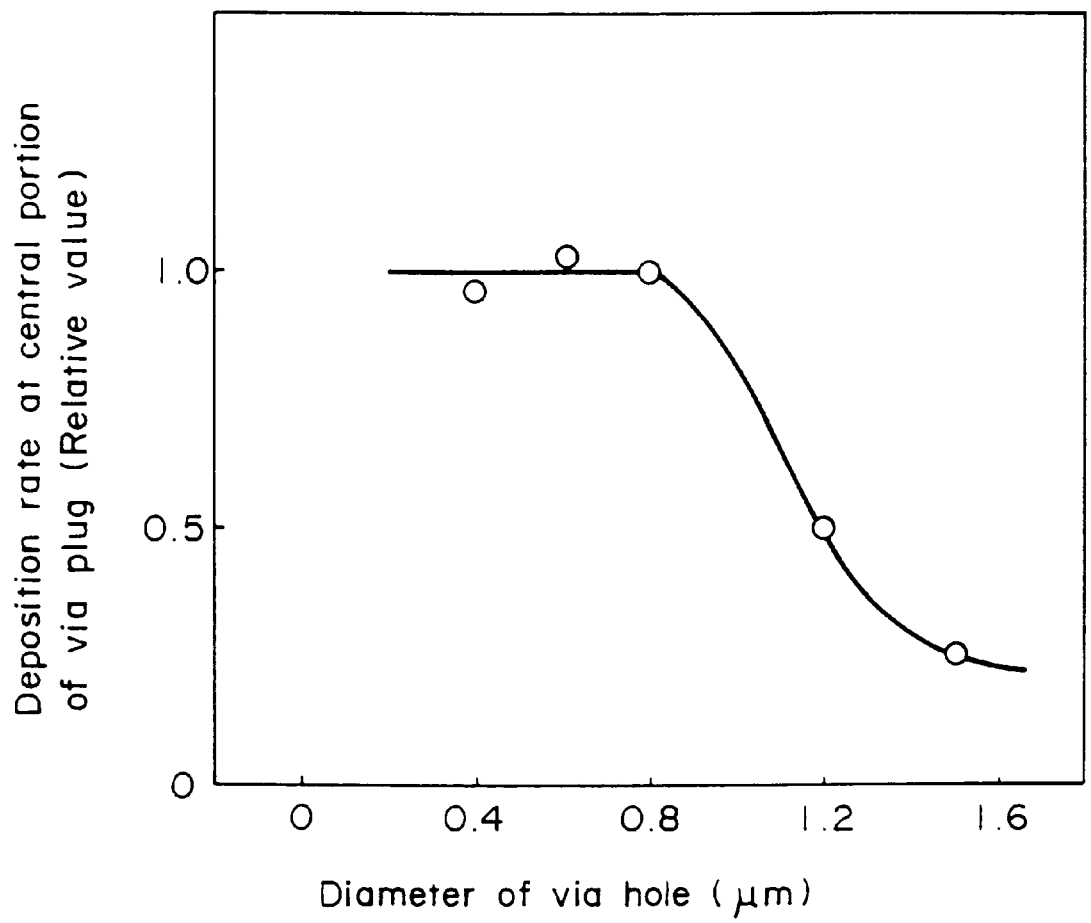
FIG. 22 is a graph showing the relationship between the diameter of the via hole and deposition rate at the central portion of the via plug formed in the via hole.

FIG. 22 is a graph showing the results obtained by examining the sectional shapes of via plugs 5 formed in via holes having different diameters. The relative values obtained by converting the heights of the central portions of the via plugs 5 into Al deposition rates and normalizing these Al deposition rates with respect to the via hole 4 having the diameter of 0.8 μm were plotted along the ordinate. As is apparent from FIG. 22, the relative values are kept almost constant when the diameters of the via holes 4 are 0.8 μm or less. Within this range, the via plug 5 having the protruding central portion shown in FIG. 18 was formed. On the other hand, when the diameter of the via hole 4 exceeded 0.8 μm, the via plug 5 having the recessed central portion shown in FIG. 19 was formed. The deposition rate calculated with reference to the height of the central portion was decreased. Therefore, in order to increase the degree of integration of a semiconductor device having a multilevel interconnection structure, it is preferable to limit the diameter of the via hole 4 to be 0.8 μm or less.

The mechanism for changing the shape of the via plug 5 in accordance with the diameter of the via hole 4 is not yet clear. However, it was confirmed that almost identical shapes were obtained within the range of conditions capable of selectively forming via plugs 5. The conditions capable of selectively forming via plugs 5 were a substrate temperature of 170 to 260° C., a total pressure of 0.5 to 5 torr, and a DMAH partial pressure of 3 to 80 mtorr.

To examine the shape of the via plug 5 obtained when a mask for forming the via hole 4 did not have a square shape, via holes 4 were formed using rectangular masks having ratios of long sides to short sides being 1.5 and 2.0, and via plugs 5 were formed by Al-CVD method. As a result, if the sectional area of each via hole 4 was 0.5 $\mu m^2$ or less, i.e., had a circle having a diameter of 0.8 μm or less, a via plug 5 having the shape shown in FIG. 20 was obtained.

An electromigration test was conducted using a sample formed using a Kelvin pattern. This test was performed at an ambient temperature of 200° C. at a current density of the via plug 5 of 10 $MA/cm^2$.

Figure 23:
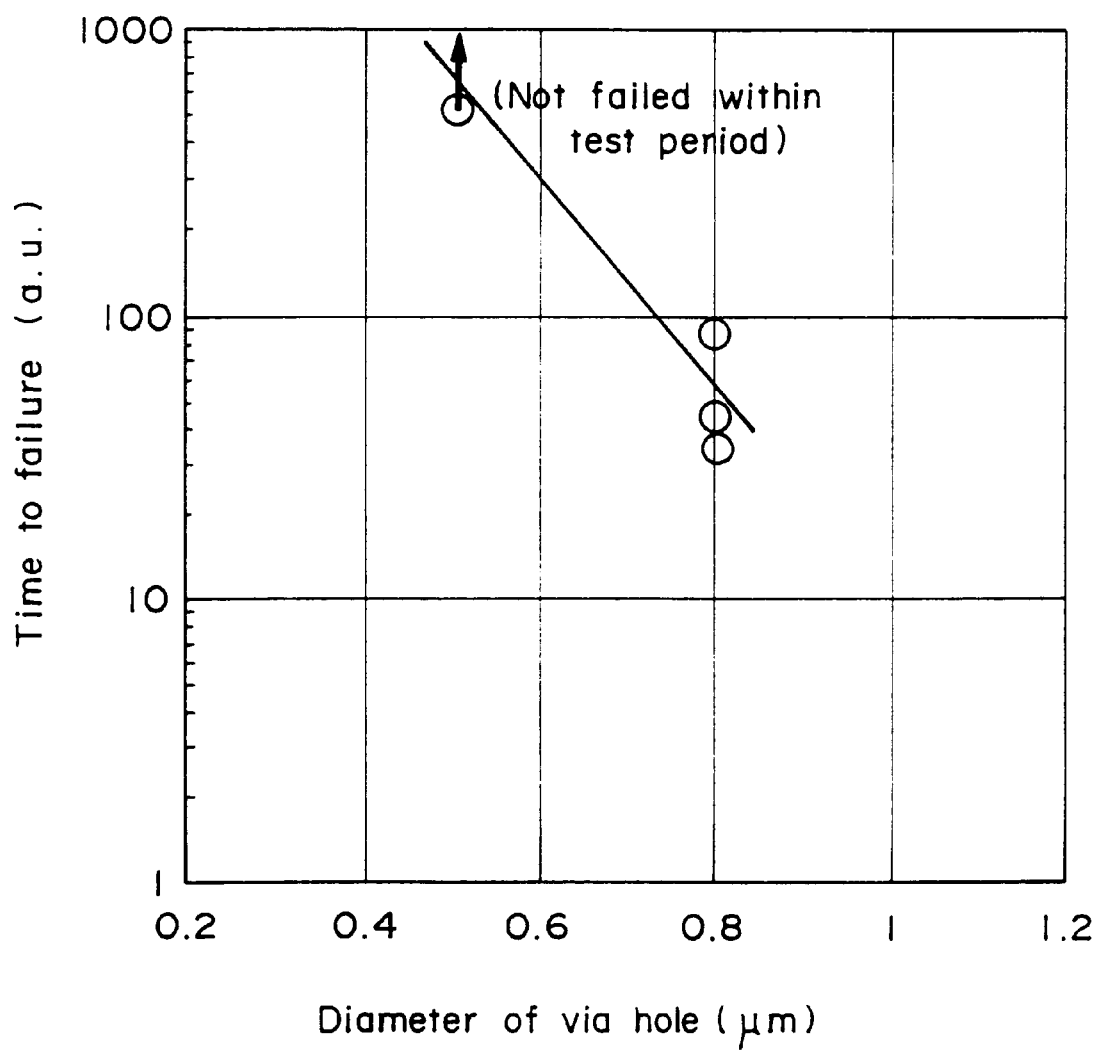
FIG. 23 is a graph showing results obtained such that reliability against electromigration was evaluated from the relationship between the diameter of the via hole and a time to failure.

The results are shown in FIG. 23. A time to failure representing a time period until the resistance is increased by 5% from the start of the test is plotted along the ordinate. Judging from these results, when the diameter of the via hole 4 was 0.5 μm or less, i.e., when the sectional area of the via hole 4 was 0.2 $\mu m^2$ or less, the time to failure was increased to 10 times or more as compared with the via hole 4 having the diameter of 0.8 μm. It is apparent that extremely high reliability against electromigration is exhibited.

Figure 24:
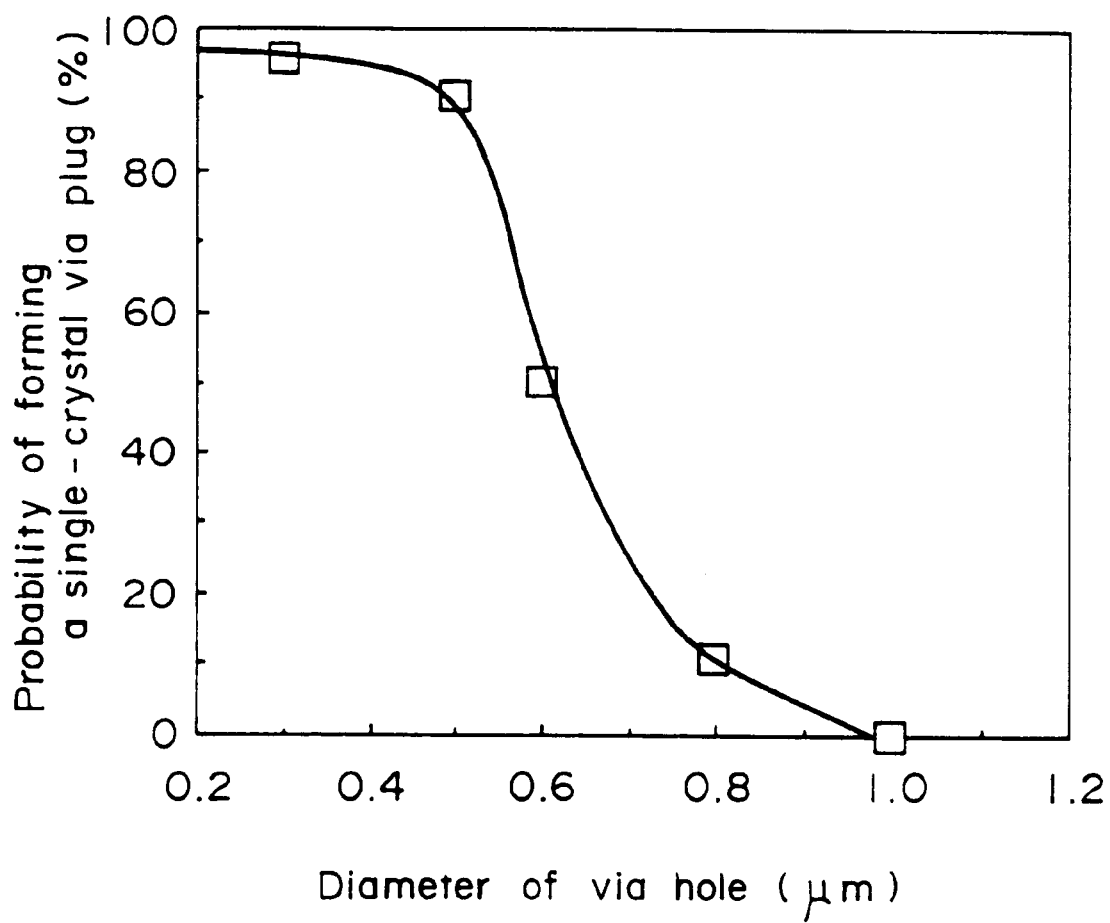
FIG. 24 is a graph showing the probability for forming a single-crystal via plug to the diameter of the via hole.

In order to clarify this cause, the crystal structure of the via plug 5 was examined from its sectional direction, using a TEM (Transmission Electron Microscope). As a result, as shown in FIG. 24, when the diameter of the via hole 4 was 0.5 μm or less, the via plug had a single crystal with a probability of 90% or more. As is generally known, Al atoms are moved through the grain boundary. The movement of the Al atoms is inhibited in the single crystal. As shown in FIG. 23, reliability is greatly improved.

As described above, the sectional area of the via hole 4 is limited to 0.5 $\mu m^2$ or less to increase the degree of integration, and its sectional area is limited to 0.2 $\mu m^2$ to improve reliability. In practice, for example, like a power supply wiring, at a portion where a large current which cannot flow through such a fine via hole must flow, via holes each having the above size or less are prepared in a required number, and the wiring lines between the layers are connected in parallel with each other. At a portion where the layout area has a sufficient margin, a large alignment margin is assured, and a current density is low, the sizes (the depth and diameter) of the via holes need not fall within this range. In this case, it is preferable to assure coverage of the upper Al wiring layer without forming a via plug under the condition that the diameter of the via hole is set to, e.g., 2 μm or more.

Embodiment 3

An underlying layer 2a constituted by forming a TiN film having a thickness of 100 nm on a Ti film having a thickness of 50 nm, an Al-0.5 wt % Cu alloy film 2b having a thickness of 500 nm, and a TiN film 2c having a thickness of 30 nm are stacked on a lower device layer 2 as in Embodiment 1 to form a lower Al wiring layer 2. In this case, the TiN film 2c serves as an anti-reflection film for reducing the reflectance to the exposure light to improve precision of formation of the lower Al wiring 2.

Figure 25:
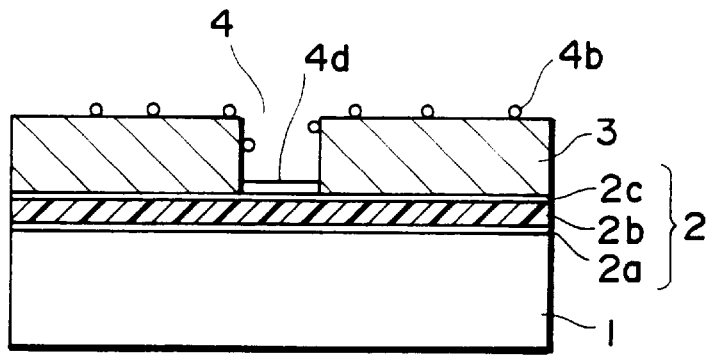
FIGS. 25 to 28 are views showing steps in the manufacture of a semiconductor device different from the semiconductor device shown in FIG. 6 and having a multilevel interconnection structure according to the present invention.

An $SiO_2$ film having a thickness of 1 μm as an insulating interlayer 3 is formed on the lower Al wiring layer 2. A via hole 4 having a diameter of 0.5 μm is formed in the insulating interlayer 3, and the resist for forming the via hole 4 is removed. At this time, the TiN film 2c is left on the surface of the lower Al. wiring layer 2 exposed to the bottom of the via hole 4. A fluorine and oxygen rich layer 4d is formed on the surface of the TiN film 2c during dry etching or resist removal and when the surface is exposed to air. An organic contaminant 4b such as a resist residue is attached to the surface of the insulating interlayer 3 (FIG. 25).

A via plug 5 is formed. by using the same film forming apparatus, following the same procedures as in Embodiment 1.

Figure 26:
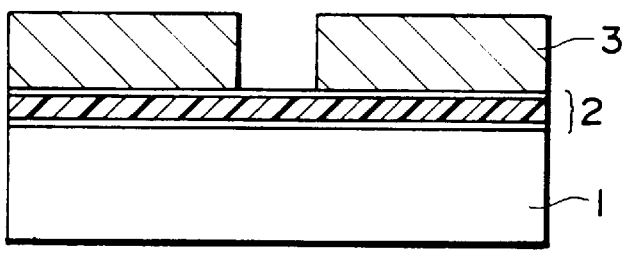

First, the substrate is loaded in the load-lock chamber, and transferred to the etching chamber via the transfer chamber. In the etching chamber, plasma etching is performed under the same conditions as in Embodiment 1. As a result, the fluorine and oxygen rich layer 4d on the surface of the TiN film 2c exposed to the bottom of the via hole 4 is removed. The organic contaminant 4b attached to the surface of the insulating interlayer 3 is also removed (FIG. 26).

Figure 27:
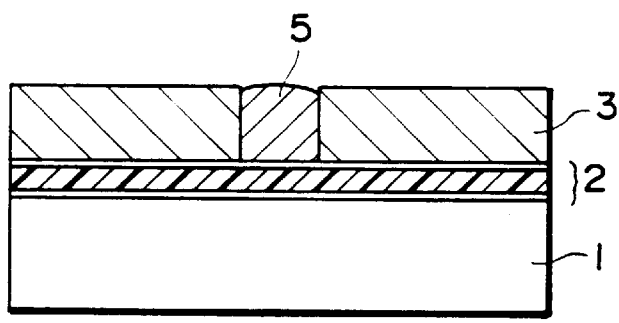
Figure 28:
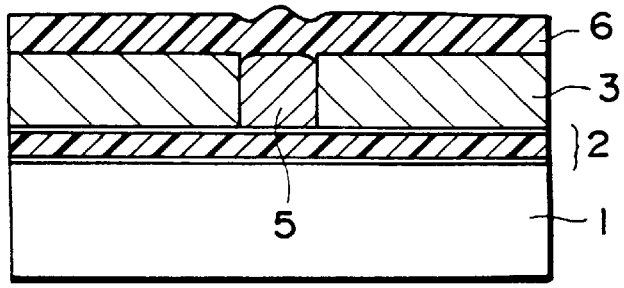

The plasma-etched substrate is then transferred to the CVD chamber via the transfer chamber. Al-CVD at this time is performed under the same conditions as in Embodiment 1 to form a via plug 5. The substrate was taken out from the film forming apparatus via the transfer and load-lock chambers, and observed with an SEM. As a result, it was confirmed that the via plug 5 was formed with good selectivity as shown in FIG. 27.

The substrate having the via plug 5 (formed by the above-described process) is then transferred to the sputtering chamber via the transfer chamber. An Al film (upper Al wiring layer 6) having a thickness of 1.0 $\mu$m is formed on the substrate.

The Al film of the substrate (FIG. 28) removed from the film forming apparatus is patterned into a predetermined shape by using the conventional photolithography and etching techniques. After the resist is removed, heating is performed in a nitrogen atmosphere at 400° C. for 60 minutes, thereby completing a semiconductor device (sample) having a predetermined shape.

The electrical characteristics of this sample were evaluated with a via chain. The via plug 5 having a relatively low resistance of 0.7 Ω (higher than that in Example 1 but relatively low) was formed with good reproducibility.

The reason why the resistance is higher than that in Embodiment 1 is that the TiN film 2c is present between the Al—Cu alloy film 2b of the lower Al wiring layer 2 and the Al via plug 5, and a contact resistance is present on the heterogeneous metal interface between the Al—Cu alloy film 2b and the via plug 5. This is not because the contact state is unstable. Therefore, this sample can be used without any problem at a portion where such a via resistance is permitted.

In Embodiment 3, even under the same conditions as in Experiment 4, when a flow rate ratio $BCl_3/(BCl_3+Cl_2)$ was within the range of 0.75 to 1, the via plug 5 could be satisfactorily formed. It can be considered that the fluorine and oxygen rich layer 4d on the surface of the TiN film 2c can be removed by the plasma having a $BCl_x$ radical concentration lower than that required for removal of the alumina film 4a formed on the surface of the lower Al wiring layer 2 shown in Embodiment 1.

As a material of the reflection preventive film, a nitride of a high melting point metal such as ZrN or WN, an oxynitride of a high melting point metal such as TiON, a boride of a high melting point metal such as TiB, or a high melting point metal such as Ti or W can be used in addition to TiN. Whatever material is used, plasma etching is effectively performed as a pretreatment to form the Al via plug with good selectivity. Note that the high melting point metals mentioned in this specification are metals having melting points of 1,500° C. or more (considering that the melting point of Si is 1,412° C., they can be defined as metals having melting points higher than that of Si).

After formation of the sample having the structure shown in FIG. 25, the TiN film 2c can be removed by dry etching using a gas atmosphere containing $BCl_3$ and $SF_6$ to expose the Al—Cu alloy film 2b to the bottom of the via hole 4. By adjusting the dry etching conditions for forming the via hole 4, the TiN film 2c can be removed at the same time. In both cases, the Al via plug 5 can be formed in the same steps as in Embodiment 1. In addition, it is possible to remove the TiN film 2c in the etching chamber of the film forming apparatus of Embodiment 1, perform plasma etching under a pertinent conditions, and perform the selective Al-CVD (formation of the via plug). In this case, the surface of the Al—Cu alloy film 2b exposed to the bottom of the via hole 4 is not exposed to an oxygen plasma or air, so that no alumina film is formed. Therefore, even under the conditions shown in Experiment 4, when the flow rate ratio $BCl_3/(BCl_3+Cl_2)$ is within the range of 0.25 to 1, the via plug 5 can be satisfactorily formed. A condition that the ion energy is lower than that in Embodiment 1, and the chlorine compound content combined with the surface of the insulating interlayer is less than that in Embodiment 1 can also be used.

Embodiment 4

Next, as Embodiment 4, applied examples 4-1a to 4-6 will be explained with reference to FIGS. 29 to 40.

Applied example 4-1a

Figure 29:
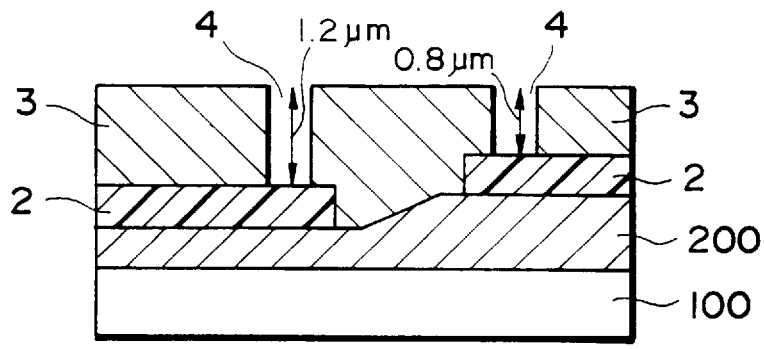
FIGS. 29 to 32 are views showing steps in the manufacture of semiconductor devices which are different from the semiconductor device shown in FIG. 6 and having a multilevel interconnection structure according to the present invention (Embodiment 3)
Figure 30:
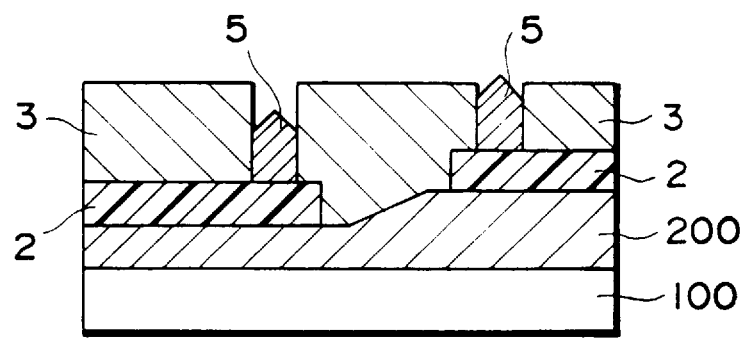

First, a lower wiring layer 2 is formed on an underlying insulating layer 200 of a semiconductor substrate 100, and further an insulating interlayer 3 is formed on the lower wiring layer 2. Next, a first via hole having a diameter of 0.5 $\mu$m and a depth of 0.8 $\mu$m and a second via hole having a diameter of 0.5 $\mu$m and a depth of 1.2 $\mu$m are formed in the insulating interlayer 3 (FIG. 29).

The above-described lower wiring layer 2 has a structure that a Ti film (50 nm thick film), a lower TiN film (0.1 $\mu$m thick film), an AlCu alloy film (0.5 wt % Cu concentration, 0.5 $\mu$m thick film), and an upper TiN film (30 nm thick film) are laminated in order from the bottom. Further, at the time of forming the via hole, in the upper TiN film, a region located at the bottom of the via hole is removed.

Next, a via plug 5 is formed in each via hole 4 (FIG. 30) by the same procedures (selective Al-CVD) as in Embodiment 1 as described above. At this time, the central portion of the surface of each via plug 5 was shaped to the protrusion. Further, because each via plug 5 was formed to bury the 0.8 $\mu$m deep first via hole 4 optimally, it could not bury up to the top portion of the 1.2 $\mu$m via hole 4.

Figure 31:
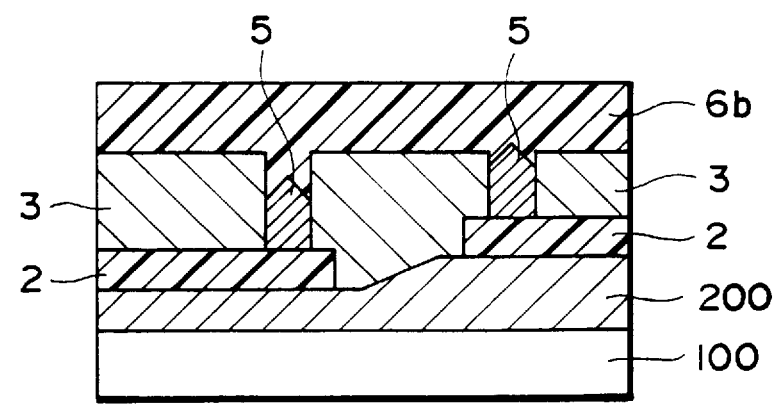

Further, in the sputtering chamber, an AlCu alloy film 6b for an upper wiring 6 is formed to a thickness of 0.8 $\mu$m (FIG. 31). The surface of the insulating interlayer 3 is completely covered by the AlCu alloy film 6b. The deposition rate of the AlCu film 6b is 0.5 $\mu$m/min, and the surface temperature of the substrate holder (hereinafter called substrate temperature) is 400° C. Under this condition, the AlCu film 6b can completely bury with the via hole 4 having any depth and the surface of the AlCu alloy film 6b is almost flat as shown in FIG. 31.

Figure 32:
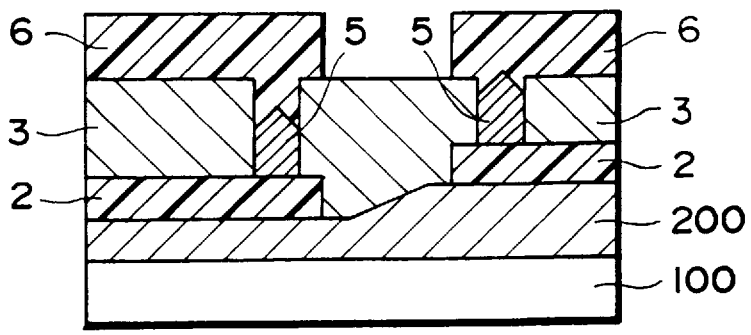

Finally, as shown in FIG. 32, the above-described AlCu alloy film 6b is processed into the predetermined pattern to form the upper wiring 6, and thereafter heating is performed in a nitrogen atmosphere at 400° C. for 30 minutes.

To the sample obtained in the above process, the sectional shape of the sample was observed with an SEM and the via resistance was measured.

Figure 33:
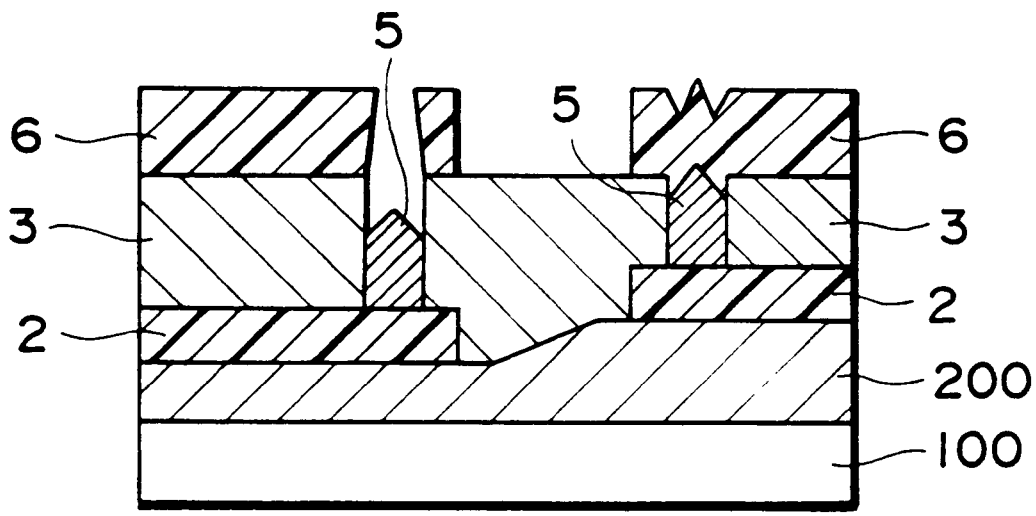
FIG. 33 is a view showing the first condition of a semiconductor device after an upper wiring layer is formed.
Figure 34:
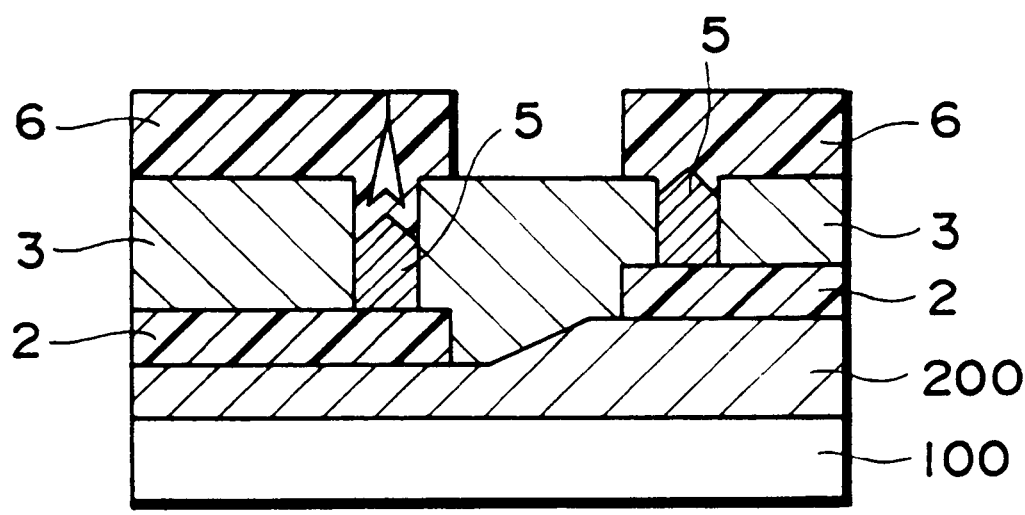
FIG. 34 is a view showing the second condition of a semiconductor device after an upper wiring layer is formed.
Figure 36:
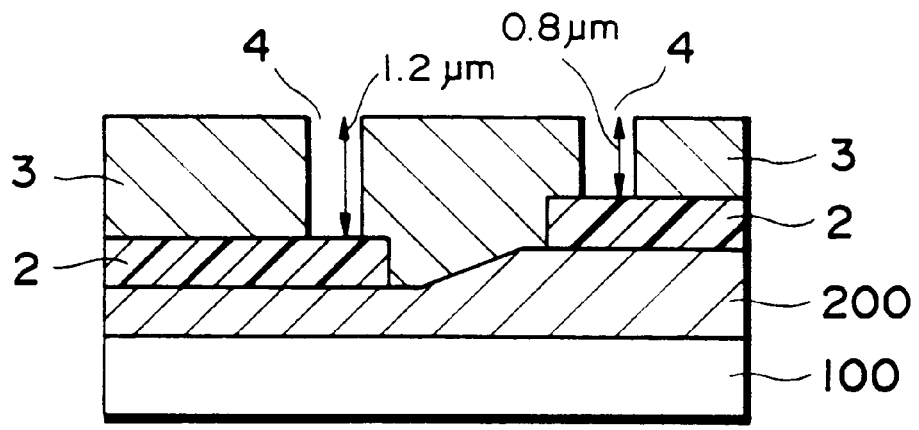
FIGS. 36 to 40 are views showing the manufacturing process of each semiconductor device having an upper wiring with the different structure based on the semiconductor devices shown in FIGS. 29 to 32.

It is noted that the inventors understood that in other experiments, the sectional shape of the upper wiring 6 was varied depending on the substrate temperature at the time of deposition of the AlCu alloy film 6b as shown in FIGS. 32 to 34 (in other words, the optimum range of substrate temperature to form the upper wiring 6 is found).

The upper wiring 6 of each sample was evaluated and the results are shown in FIG. 35. The evaluated samples will be described hereinafter but the evaluation of the sample of Applied example 4-1a already explained is equivalent to a sample No. 13 of a table in FIG. 35.

Here, the via resistance is a value obtained by forming a via chain having a depth of 0.8 μm. The explanations of symbols used in the FIG. 35 are as follows.

That is,

X: means that the sectional shape of the sample is the same as the one shown in FIG. 33.

Δ: means that the sectional shape of the sample is the same as the one shown in FIG. 34 and the via resistance of the sample is greater than or equal to 0.5 (Ω/via).

○: means that the sectional shape of the sample is the same as the one shown in FIG. 32 (or FIG. 40 described hereinafter) and the via resistance of the sample is greater than or equal to 0.5 (Ω/via).

▲: means that the sectional shape of the sample is the same as the one shown in FIG. 34 and the via resistance of the sample is less than 0.5 (Ω/via).

●: means that the sectional shape of the sample is the same as the one shown in FIG. 32 (or FIG. 40 described hereinafter) and the via resistance of the sample is less than 0.5 (Ω/via).

It is apparent from FIG. 35 that in a case that the AlCu alloy film 6b was deposited at the substrate temperature of 300° C. or higher, the via hole 4 having the depth of 0.8 μm could completely be buried (condition that any space was left between the via plug 5 and the AlCu alloy film 6b in the via hole 4), and therefore the satisfied via resistance was obtained. Further, in a case that the AlCu alloy film 6b was deposited at the substrate temperature of 400° C. or more, the via hole 4 having the depth of 1.2 μm could be also completely buried. On the other hand, at the temperature of 500° C. or more, in a case that the line width of the lower wiring layer 2 was 0.35 μm, it was observed that phenomenon of increasing the wire resistance by 10% or more with frequency of 20% but at the temperature of 475° C. or less, the phenomenon appeared with frequency of less than 1%.

Accordingly, in a case that the depth of the via holes 4 is uniform, the optimum range of the substrate temperature is 300° C. to 475° C., and temperature difference, (hereinafter referred to as process window) of 175° C. (=475° C.–300° C.) can be obtained. On the other hand, in a case that the nonuniformity of the depth of the via hole 4 is allowed to the maximum of 0.4 μm, the optimum range of the substrate temperature is 400° C. to 475° C., and the process window becomes narrow to 75° C. (=475° C.–400° C.)

In this case, the reason why the satisfied burying was achieved can be considered that in addition to the fluidity of the AlCu alloy film 6b being enhanced, as the upper portion of the via plug 5 also has the fluidity so that both flow together. In fact, it was known by the observation with a cross section TEM that no boundary exists between the plug and the AlCu alloy film but both are joined.

Applied example 4-1b

A via plug 5 is formed by the same procedures as in Applied example 4-1a as described above, and for a moment, a substrate is taken out from a film forming apparatus and exposed to air for 10 minuet. Thereafter, in order to remove an alumina film formed on the surface of the via plug 5 during the substrate is exposed to air, the substrate is inserted in an etching chamber, and etching is performed in an Ar gas atmosphere. Then, the substrate is transferred to a sputtering chamber through a vacuum transfer chamber, and an AlCu film 6b is deposited at the various temperature (the evaluation of the sample obtained in Applied example 4-1b is equivalent to a sample No. 11 in the chart shown in FIG. 35).

In result, it is apparent from FIG. 35 that although the depth of the via holes 4 is uniform, the optimum range of the substrate temperature is 400° C. to 475° C., and the process window becomes narrow to 75° C. (=475° C.–400° C.). Further, in a case that the nonuniformity of the depth of the via hole 4 is allowed to the maximum of 0.4 μm, the optimum range of the substrate temperature is 425° C. to 475° C., and the process window becomes narrow to 50° C. (=475° C.–425° C.).

The reason why the required substrate temperature for burying is higher compared to a case of Applied example 4-1a can be considered that a flow of the AlCu alloy film 6b is obstructed by contaminants which cannot be removed by the Ar sputtering and moreover the fluidity of the upper portion of the via plug is lowered.

Applied example 4-2a

A via plug 5 is formed by the same procedures as in Applied example 4-1a described above. Next, a substrate is transferred to a sputtering chamber through a vacuum transfer chamber, and a first AlCu film is deposited to a thickness of 0.4 μm at the substrate temperature of 100° C. or less. Continuously after the substrate is heated at the various temperature for two minutes in a heating chamber, a second AlCu alloy film is further deposited to a thickness of 0.4 μm. Then, the AlCu alloy film (formed in two stages) to be an upper wiring 6 of the substrate, which is taken out from the film forming apparatus, is processed into the predetermined pattern, and heating is performed in a nitrogen atmosphere at the substrate temperature of 400° C. for 30 minutes (the evaluation of the sample obtained in Applied example 4-2b is equivalent to a sample No. 13 in the table shown in FIG. 35).

To the sample obtained in the above process, the sectional shape of the sample was observed with an SEM and the via resistance was measured. In result, it is apparent from FIG. 35 that in a case that the heating was performed at the substrate temperature of 400° C. or more, the via hole 4 having the depth of 0.8 μm could completely be buried with the AlCu alloy film, and the satisfied via resistance was obtained. Further, in a case that the heating was performed at 450° C. or more, the via hole 4 having the depth of 1.2 μm could also be completely buried with the AlCu alloy film. On the other hand, at the substrate temperature of 550° C. or more, in a case that the line width of the lower wiring layer 2 was 0.35 μm, it was observed that phenomenon of increasing the wire resistance by 10% or more appeared with frequency of 25% but at the temperature of 525° C. or less, the phenomenon was appeared with frequency of less than 1%. The reason why the temperature which the phenomenon of increasing the wire resistance is appeared is higher compared to Applied example 4-1a as described above can be considered that in the case of Applied example 4-1a, the substrate temperature is increased during the AlCu alloy film 6b (FIG. 31) is being deposited.

Accordingly, in a case that the depth of the via holes 4 is uniform, the optimum range of the substrate temperature is 400° C. to 525° C., and the process window of 125° C. (=525° C.–400° C.) can be obtained. Further, in a case that the nonuniformity of the depth of the via hole 4 is allowed to the maximum of 0.4 μm, the optimum range of the substrate temperature is 450° C. to 525° C., and the process window becomes narrow to 75° C. (=525° C.–450° C.).

In this case, the upper portion of the via plug 5 and the AlCu alloy film 6b are flowed together during heating, so that the burying property may be improved.

Applied example 4-2b

A via plug 5 is formed by the same procedures as in Applied example 4-2a as described above, and a substrate is taken out from a film forming apparatus and exposed to air for 10 minuet. Thereafter, the substrate is inserted in an etching chamber, and etching is performed in an Ar gas atmosphere. Then, the substrate is transferred to a sputtering chamber through a transfer chamber, and an AlCu alloy film 6b is deposited. (the evaluation of the sample obtained in Applied example 4-2b is equivalent to a sample No. 11 in the table shown in FIG. 35).

In result, it is apparent from FIG. 35 that in a case that the depth of the via holes 4 is uniform, the optimum range of the substrate temperature is 450° C. to 525° C., and the process window of 125° C. (=525° C.–450° C.) can be obtained. Further, in a case that the nonuniformity of the depth of the via hole 4 is allowed to the maximum of 0.4 μm, the optimum range of the substrate temperature is 500° C. to 525° C., and the process window is only 25° C. (=525° C.–500° C.).

The reason why the required substrate temperature for burying is higher compared to a case of Applied example 4-2a can be considered that a flow of the AlCu alloy film 6b is obstructed by contaminants which cannot be removed by the Ar sputtering and moreover the fluidity of the upper portion of the via plug is lowered.

Applied example 4-3a

Figure 37:
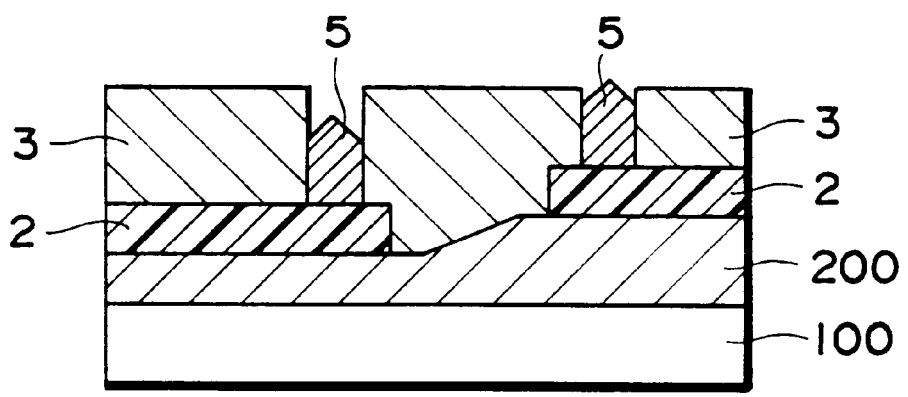
Figure 38:
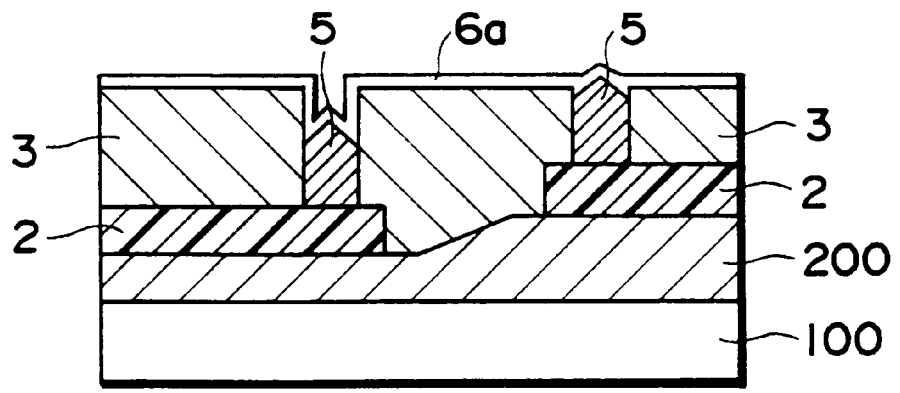
Figure 39:
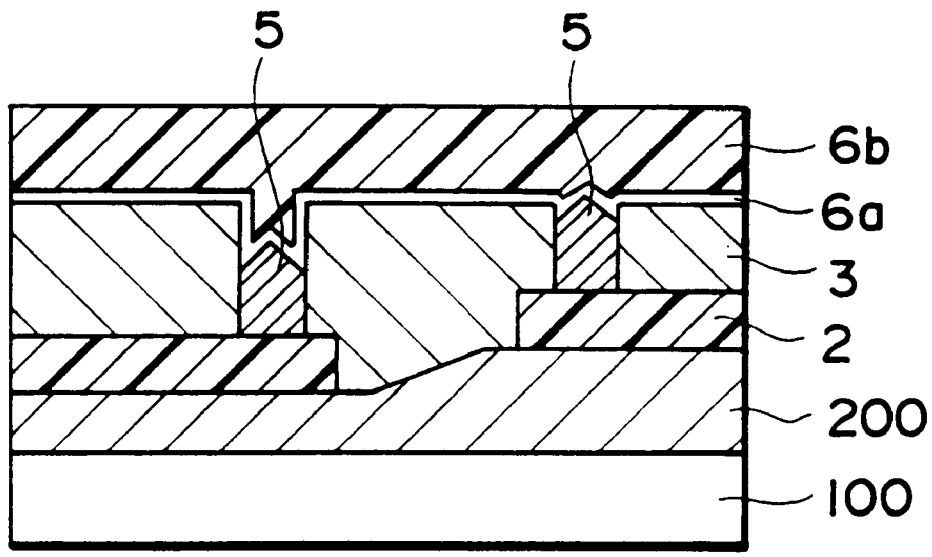

A via plug 5 is formed on a substrate (FIG. 36), in which the two kinds of the via holes 4 are formed by the same procedures as in Applied example 4-1a described above, by the same method (selective Al-CVD) (FIG. 37). Thereafter, the substrate (FIG. 37) is transferred to a first sputtering chamber through a transfer chamber, and an underlying Ti film 6a having a thickness of 20 nm is deposited by the collimator sputtering method (FIG. 38). Next, the substrate (FIG. 38) is transferred to a second sputtering chamber through the transfer chamber, and an AlCu alloy film 6b having a thickness of 0.8 μm is deposited at the various temperature (an upper wiring 6 is formed by the underlying Ti film 6a and the AlCu alloy film 6b). At this time, in a case that the AlCu alloy film 6a is deposited at the substrate temperature of 400° C., as shown in FIG. 39, the via hole 4 having any depth can completely be buried with the underlying Ti film 6a and the AlCu alloy film 6b, and the AlCu alloy film 6b having an almost flat surface can be obtained.

Figure 40:
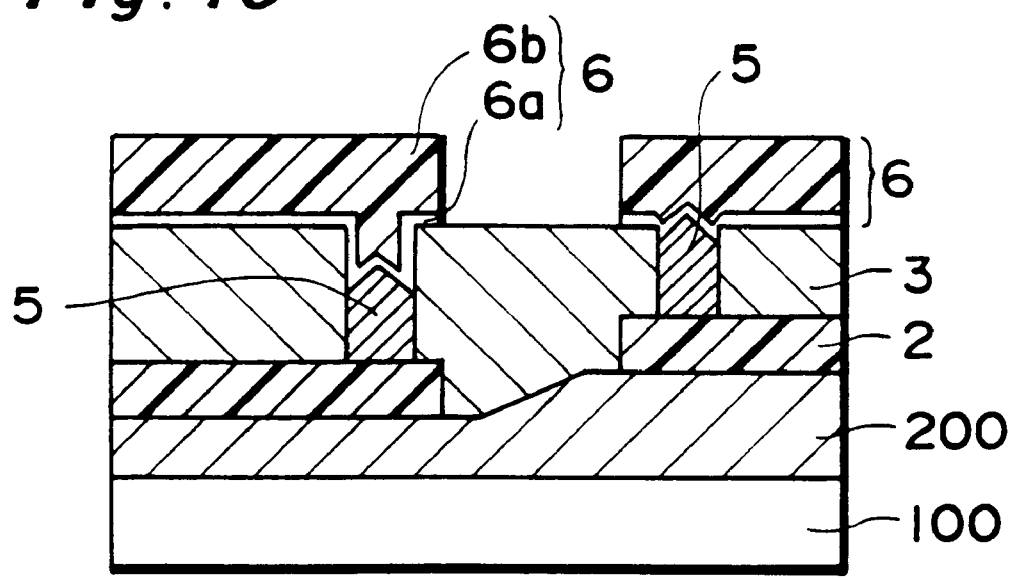

Next, the underlying Ti film 6a and the AlCu alloy film 6b are processed into the predetermined pattern to form an upper wiring 6 (FIG. 40). Thereafter, the substrate (FIG. 40) is heated (the evaluation of the sample obtained in Applied example 4-3a is equivalent to a sample No. 14 in the table shown in FIG. 35).

To the sample obtained in the above process, the sectional shape of the sample was observed with an SEM and the via resistance was measured. It is noted that the sectional shape of the semiconductor device was varied as shown in FIG. 33, FIG. 34 (the underlying Ti film 6a is omitted in these figures) and FIG. 40 depending on the substrate temperature at the time of deposition of the AlCu alloy film 6b.

In result, it is apparent from FIG. 35 that in a case that the AlCu alloy film 6b was deposited at the substrate temperature of 300° C. or more, the via hole 4 having the depth of 0.8 μm could be completely buried with the AlCu alloy film 6b. However, the satisfied via resistance could not be obtained below 350° C. The reason for this can be considered that the underlying Ti film 6a exists between the AlCu alloy film 6b and the via plug 5, so that the contact resistance caused by the heterogeneous metal interface is generated. On the other hand, in a case that the AlCu alloy film 6b is deposited at 350° C. or higher, the via hole 4 having the depth of 1.2 μm can completely be buried with the AlCu alloy film 6b, and the satisfied via resistance is obtained. It is considered that this is because of the following mechanism. That is, during depositing of the AlCu alloy film 6b, alloyed reaction occurs in the interface between the AlCu alloy film 6b and the underlying Ti film 6a, and in the via plug 5, and then, the underlying Ti film 6a is converted to the alloy mainly comprising Al.

Further, the alloy discontinuously exists near the above-said interface, and the interface in which the Al alloys are contacted each other is formed, so that the contact resistance caused by the heterogeneous metal interface is lowered.

The inventors understood that an Al$_3$Ti alloy is formed near the aforesaid interface by an X ray diffractometry of the sample made at the substrate temperature of 400° C. Further, it can be considered that the fluidity of the AlCu alloy film 6b is enhanced due to the alloyed reaction, therefore the satisfied deposition is possible at lower temperature compared to the above-described Embodiment 4-1a.

Accordingly, the optimum range of the substrate temperature is 350° C. to 475° C. for both a case of the uniform depth of via holes 4 and a case of allowing the nonuniformity of the depth of the via hole 4 to the maximum of 0.4 μm, and the process window of 125° C. (=475° C.–350° C.) can be obtained. It is noted that if the above-described underlying Ti film 6a is too thick, the Al$_3$Ti alloy film gets thicker, thereby the resistance as the upper wiring 6 is increased. On the other hand, if the underlying Ti film 6a is too thin (especially, in a case that the via plug 5 is not formed up to the top portion of the via hole 4), the effect of improving the fluidity at the concave part which is constituted by the via plug 5, the via hole 4, and the side wall is lowered. Accordingly, the allowable range of the thickness of the underlying Ti film 6a is varied depending on the structure of the sample, the condition of forming the Ti film, or the condition of depositing the AlCu film but usually the thickness is selected within the range of 10 to 50 nm or more preferably, within the range of 15 to 30 nm.

Further, other than Ti, metals in the IVa group such as Zr and Hf or silicides of the metals have the same effect as that of the above-described underlying Ti film 6a. Further, the materials such as Si, Cu, and Ge which react with Al to form the alloy having the lower melting point than that of Al are effective.

Applied example 4-3b

A via plug 5 is formed on a substrate, in which the two kinds of the via holes 4 are formed by the same procedures as in Applied example 4-1a described above, by the same method (selective Al-CVD). Thereafter, the substrate is KA 93-4 taken out from a film forming apparatus and exposed to air for 10 minuet. Then, the substrate is inserted in an etching chamber, and etching is performed in an Ar gas atmosphere. Further, the substrate is transferred to a first sputtering chamber through a vacuum transfer chamber, and an underlying Ti film 6a is deposited, and continuously an AlCu alloy film 6b is deposited in a second sputtering chamber (the evaluation of the sample obtained in Applied example 4-3b is equivalent to a sample No. 12 in the table shown in FIG. 35).

In result, it is apparent from FIG. 35 that in a case that the depth of the via holes 4 is uniform, the optimum range of the substrate temperature is 350° C. to 475° C., and the process window of 125° C. (=475° C.–350° C.) can be obtained. On the other hand, in a case that the nonuniformity of the depth of the via hole 4 is allowed to the maximum of 0.4 μm, the optimum range of the substrate temperature is 400° C. to 475° C., and the process window becomes narrow to 75° C. (=475° C.–400° C.).

Applied example 4-4a

A via plug 5 is formed on a substrate, in which the two kinds of the via holes 4 are formed by the same procedures as in Applied example 4-1a as described above, by the same method (selective Al-CVD). The substrate is transferred to a first sputtering chamber through a transfer chamber, and an underlying Ti film 6a is deposited to a thickness of 20 nm. Then, the substrate is transferred to a second sputtering chamber and a first AlCu alloy film is deposited to a thickness of 0.4 μm at the substrate temperature of 100° C. or less. Thereafter, the substrate obtained in the second sputtering chamber is heated at the various temperature for two minutes. Then, the substrate is transferred to the second sputtering chamber again, and a second AlCu alloy film is further deposited to a thickness of 0.4 μm.

Finally, the AlCu alloy film (formed in two stages) on the substrate which is taken out from the film forming apparatus is processed into the predetermined pattern, and heating is performed (the evaluation of the sample obtained in Applied example 4-4a is equivalent to a sample No. 14 in the table shown in FIG. 35).

To the sample obtained in the above process, the sectional shape of the sample was observed with an SEM and the via resistance was measured. In result, it is apparent from FIG. 35 that in a case that the heating is performed at the substrate temperature of 400° C. or more, the via hole 4 having the depth of 0.8 μm can completely be buried with the AlCu alloy film, and the satisfied via resistance is obtained. Further, in a case that the heating is performed at the substrate temperature of 425° C. or more, the via hole 4 having the depth of 1.2 μm can be also completely converted with the AlCu alloy film, and the satisfied via resistance is obtained.

Accordingly, in a case that the depth of the via holes 4 is uniform, the process window of 125° C. (=525° C.–400° C.) is obtained, and in a case that the nonuniformity of the depth of the via hole 4 is allowed to the maximum of 0.4 μm, the process window of 100° C. is obtained. For both cases, the fluidity of the AlCu alloy film during heating is enhanced due to the alloyed reaction, therefore the via hole 4 can be buried with the AlCu alloy film at lower temperature compared to the case of Applied example 4-2a.

Applied example 4-4b

A via plug 5 is formed on a substrate, in which the two kinds of the via holes 4 are formed by the same procedures as in Applied example 4-1a as described above, by the same method (selective Al-CVD). The substrate is taken out from a film forming apparatus and exposed to air for 10 minuet. Thereafter, the substrate is inserted in an etching chamber, and etching is performed in an Ar gas atmosphere. Then, the substrate is transferred to a first sputtering chamber through a transfer chamber, and an underlying Ti film 6a is deposited, and continuously an AlCu alloy film 6b is deposited in a second sputtering chamber (the evaluation of the sample obtained in Applied example 4-4b is equivalent to a sample No. 12 in the table shown in FIG. 35).

In result, it is apparent from FIG. 35 that in a case that the heating is performed at the substrate temperature of 425° C. or more, the via hole 4 having the depth of 0.8 μm can completely be buried with the AlCu alloy film 6b, and the satisfied via resistance is obtained. Further, in a case that the heating is performed at the substrate temperature of 450° C. or more, the via hole 4 having the depth of 1.2 μm can completely be covered with the AlCu alloy film 6b.

Accordingly, in a case that the depth of the via holes is uniform, the process window of 100° C. is obtained, and in a case that the nonuniformity of the depth of the via hole 4 is allowed to the maximum of 0.4 μm, the process window of 75° C. is obtained.

Applied example 4-5

A via plug 5 is formed on a substrate, in which the two kinds of via holes 4 are formed by the same procedures as in Applied example 4-1a as described above, by the same method (selective Al-CVD). Next, in this applied example, a Ti film having a thickness of 20 nm is deposited as an underlying metal layer of an upper wiring layer 6, and a TiN film is further deposited to a thickness of 50 nm on the Ti film (deposition of the TiN film is performed in a first sputtering chamber by a reactive sputtering method). Thereafter, an AlCu film is deposited to a thickness of 0.8 nm at the various temperature. Next, the AlCu film and the underlying metal film (TiN/Ti) are processed into the predetermined pattern to form the upper wiring layer 6, and thereafter heating is performed in a nitrogen atmosphere (the evaluation of the sample obtained in Applied example 4-5 is equivalent to a sample No. 15 in the table shown in FIG. 35).

In result, it is apparent from FIG. 35 that in a case that the AlCu film was deposited at the substrate temperature of 350° C. or more, the via hole 4 having the depth of 0.8 μm could completely be buried with the AlCu film. On the other hand, the via hole 4 having the depth of 1.2 μm could completely be buried with the AlCu film at the substrate temperature of 450° C. or more. Compared to the case of Applied example 4-3a, the alloyed reaction did not occur between the AlCu film and the TiN film of the underlying metal layer, so that the effect of improving the fluidity of the AlCu film was small, furthermore the upper portion of the via plug 5 does not flow because the upper portion is fixed to the TiN film. The required substrate temperature got higher because the via hole 4 was completely buried. Further, the via resistance was greater than 0.5 Ω/via in the range of substrate temperature used in experiment. It is considered that this is because the TiN film exists between the upper wiring layer 6 and the via plug 5, therefore the contact resistance caused by the heterogeneous metal interface is generated.

Accordingly, in a case that the depth of the via holes 4 is uniform, the process window which can obtain the satisfied AlCu covering is 125° C. On the other hand, in a case that the nonuniformity of the depth of the via hole 4 is allowed to 0.4 μm, the process window is 25° C. It is noted that since the via resistance is high for the aforesaid semiconductor device (Applied example 4-5), the use of the device which needs a low via resistance is limited. Further, the electromigration resistance is degraded due to the fact that the transportation of the Al and Cu atoms by the current stress is discontinuous near the interface between the upper wiring layer 6 and the via plug 5 because of the existence of the TiN film.

Similar to Applied example 4-4a, the via hole 4 can completely be buried with the AlCu film within some range of temperature by depositing the AlCu film at low temperature and heating the substrate. However, the via resistance is also high, similar to the case of deposing the AlCu film at high substrate temperature.

Applied example 4-6

A via plug 5 is formed on a substrate, in which the two kinds of the via holes 4 are formed by the same procedures as in Applied example 4-1a as described above, by the same method (selective Al-CVD). Next, in this applied example, a Ti film having a thickness of 20 nm is deposited as an underlying metal layer of an upper wiring layer 6, and a TiN film is deposited to a thickness of 50 nm on the Ti film, and a Ti film is further deposited on the TiN film to a thickness of 20 nm (deposition of TiN film is performed in a first sputtering chamber by a reactive sputtering method). Thereafter, an AlCu film is deposited to a thickness of 0.8 nm at the various temperature. Next, the AlCu film and the underlying metal film (Ti/TiN/Ti) are processed into the predetermined pattern to form the upper wiring layer 6, and thereafter heating is performed in a nitrogen atmosphere (the evaluation of the sample obtained in Applied example 4-5 is equivalent to a sample No. 16 in the table shown in FIG. 35).

In result, it is apparent from FIG. 35 that in a case that the AlCu film is deposited at the substrate temperature of 350° C. or more, the via hole 4 having the depth of 0.8 μm can completely be covered with the AlCu film. Further, in a case of the substrate temperature of 425° C. or more, the via hole 4 having the depth of 1.2 μm can completely be buried with the AlCu film. Similar to the case of Applied example 4-3a, the alloyed reaction is occur in the interface between the AlCu film and the TiN film, so that the fluidity of the AlCu film is enhanced. However, compared to Applied example 4-3a, in this applied example, the required substrate temperature to bury the via hole 4 gets higher. It is considered that this is because the thickness of the underlying metal film of the side wall of the via hole 4 gets large, therefore the aspect ratio (the depth to diameter ratio of the via hole 4 which has to be buried with the AlCu film) is increased. In addition, the upper portion of the via plug 5 does not flow because the upper portion is fixed to the TiN film. Further, the via resistance is also high for the same reasons as in the case of Applied example 4-5.

Similar to Applied example 4-4a, the via hole 4 can completely be buried with the AlCu film within some range of temperature by depositing the AlCu film at low temperature and heating the substrate. However, the via resistance is also high, similar to the case of depositing the AlCu film at high substrate temperature.

Comparative example 4-1

The same substrate as the one in Applied example 4-1a (FIG. 29) is transferred to a sputtering chamber without depositing a via plug 5 on the substrate, and an AlCu film is deposited to a thickness of 0.8 μm at the various temperature. As a result, in the comparative example, neither the 0.8 μm deep via hole 4 nor the 1.2 μm deep via hole could be buried with the AlCu film at any temperature below 500° C. Further, in a case of the sample in which as an underlying metal layer of the upper wiring layer 6, a 20 nm thick Ti film was deposited by a collimator sputtering method and a 0.8 μm thick AlCu film was deposited on the Ti film, the 0.8 μm deep via hole could completely be covered with the AlCu film at the substrate temperature of 475° C. or more but the 1.2 μm deep via hole could not completely be buried with the AlCu film even at the substrate temperature of 500° C.

Comparative example 4-2

The same substrate (FIG. 29) as the one in Applied example 4-1a as described above is transferred to a sputtering chamber without forming a via plug, and a first AlCu film is deposited to a thickness of 0.4 μm at the substrate temperature of 100° C. or below. Continuously after the substrate is heated at the various temperature for two minutes, a second AlCu film is further deposited to a thickness of 0.4 μm in the sputtering chamber. In result, in the case of this comparative example, neither the 0.8 μm deep via hole nor the 1.2 μm deep via hole could be completely be buried with the AlCu film at any temperature 525° C. or less.

Further, in a case of the sample in which as an underlying metal layer of the upper wiring layer 6, a 20 nm thick Ti film was deposited by the collimator sputtering method and a 0.8 μm thick AlCu film was deposited on the Ti film, the 0.8 μm deep via hole could completely be buried with the AlCu film at the heating temperature of 475° C. or more but the 1.2 μm deep via hole could not completely be buried with the AlCu film even at the heating temperature of 525° C.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device having a multilevel interconnection structure, comprising:

at least one via hole in an insulating interlayer that is formed on a lower wiring layer, which, in turn, is formed over a semiconductor substrate;

a via plug comprising a conductive material including one of Al and an Al alloy that partially fills the via hole and electrically contacts the lower wiring layer, an upper surface of the via plug having a convex shape; and an upper wiring layer comprising an Al containing film formed over a surface of the insulating interlayer, the upper wiring layer substantially filling a remaining portion of the via hole and electrically contacting the via plug.

2. The semiconductor device according to claim 1, wherein an upper surface of the upper wiring layer over the via hole is substantially flat.

3. The semiconductor device according to claim 1, wherein a bottom surface of the via plug directly contacts an upper surface of the lower wiring layer, and wherein a side surface of the via plug directly contacts the insulating interlayer.

4. The semiconductor device according to claim 1, wherein the upper wiring layer comprises an underlying film including one of Ti, Zr, Hf, Ti silicide, Zr silicide and Hf silicide.

5. The semiconductor device according to claim 4, wherein the Al containing film substantially fills the remaining portion of the via hole.

6. The semiconductor device according to claim 4, wherein the underlying film of the upper wiring layer directly contacts the upper surface of the via plug.

7. The semiconductor device according to claim 6, wherein the Al containing film of the upper wiring layer is formed directly on the underlying film.

8. The semiconductor device according to claim 4, wherein an upper surface of the upper wiring layer over the via hole is substantially flat.

9. A semiconductor device having a multilevel interconnection structure, comprising:

at least one via hole in an insulating interlayer that is formed over a semiconductor substrate;

a via plug comprising a conductive material including one of Al and an Al alloy that partially fills the via hole and electrically contacts the lower wiring layer; and an upper wiring layer comprising an underlying film including one of Ti, Zr, Hf, Ti silicide, Zr silicide and Hf silicide and an Al containing film formed over a surface of the insulating interlayer, the upper wiring layer substantially filling a remaining portion of the via hole and electrically contacting with the via plug.

10. The semiconductor device according to claim 9, wherein the Al containing film substantially fills the remaining portion of the via hole.

11. The semiconductor device according to claim 9, wherein an upper surface of the upper wiring layer over the via hole is substantially flat.

12. The semiconductor device according to claim 9, wherein the underlying film of the upper wiring layer directly contacts an upper surface of the via plug.

13. The semiconductor device according to claim 12, wherein the Al containing film of the upper wiring layer is formed directly on the underlying film.

14. The semiconductor device according to claim 9, wherein a bottom surface of the via plug directly contacts an upper surface of the lower wiring layer; and wherein a side surface of the via plug directly contacts the insulating interlayer.

15. The semiconductor device according to claim 9, wherein an upper surface of the via plug has a convex shape.

16. The semiconductor device according to claim 15, wherein an upper surface of the upper wiring layer above the via hole is substantially flat.

17. A semiconductor device having a multilevel interconnection structure, comprising:

at least one via hole in ah insulating interlayer that is formed on a lower wiring layer, which, in turn, is formed over a semiconductor substrate, a surface of the lower wiring layer at a bottom of the via hole having a concave shape;

a via plug comprising a conductive material including one of Al and an Al alloy that at least partially fills the via hole and electrically contacts the lower wiring layer; and an upper wiring layer comprising an Al containing film formed over a surface of the insulating interlayer, the Al containing film electrically contacting the via plug.

18. The semiconductor device according to claim 17, wherein a dimension of the concave shaped region of the surface of the lower wiring layer is larger than a dimension of the via hole.

19. The semiconductor device according to claim 17, wherein an upper surface of the upper wiring layer over the via hole is substantially flat.

20. The semiconductor device according to claim 17, wherein a bottom surface of the via plug directly contacts the upper surface of the lower wiring layer; and wherein a side surface of the via plug directly contacts the insulating interlayer.

21. The semiconductor device according to claim 17, wherein the lower wiring layer comprises an Al containing film and a metal film including one of a high melting point metal and a high melting point metal compound formed on the Al containing film; and wherein a bottom surface of the via plug directly contacts the metal film of the lower wiring layer.

22. The semiconductor device according to claim 17, wherein the lower wiring layer comprises an Al containing film and a metal film including one of a high melting point metal and a high melting point metal compound formed on the Al containing film; and wherein a bottom surface of the via plug directly contacts the Al containing film of the lower wiring layer.

23. The semiconductor device according to claim 22, wherein a dimension of the concave shaped region of the surface of the lower wiring layer is larger than a dimension of the via hole.

24. A semiconductor device having a multilevel interconnection structure, comprising:

at least two via holes having different depths in an insulating interlayer that is formed on a lower wiring layer, which, in turn, is formed over a semiconductor substrate;

at least two via plugs comprising a conductive material including one of Al and an Al alloy that electrically contact corresponding wirings in the lower wiring layer, the via plugs substantially filling the shallowest via hole and partially filling the deepest via hole; and an upper wiring layer comprising an Al containing film formed over a surface of the insulating interlayer, the upper wiring layer electrically contacting the via plugs and substantially filling a remaining portion of the deepest via hole, wherein an upper surface of the upper wiring layer over the deepest via hole is substantially flat.

25. A semiconductor device having a multilevel interconnection structure, comprising:

at least two via holes having different depths in an insulating interlayer that is formed on a lower wiring layer, which, in turn, is formed over a semiconductor substrate;

at least two via plugs comprising a conductive material including one of Al and an Al alloy that electrically contact corresponding wirings in the lower wiring layer, the via plugs substantially filling the shallowest via hole and partially filling the deepest via hole; and an upper wiring layer comprising an underlying film including one of Ti, Zr, Hf, Ti silicide and Hf silicide and an Al containing film formed over a surface of the insulating interlayer, the upper wiring layer electrically contacting the via plugs and substantially filling a remaining portion of the deepest via hole.

26. The semiconductor device according to claim 25, wherein an upper surface of the upper wiring layer over the deepest via hole is substantially flat.

27. The semiconductor device according to claim 24, wherein bottom surfaces of the via plugs directly contact upper surfaces of the corresponding wirings in the lower wiring layer; and wherein side surfaces of the via plugs directly contact the insulating interlayer.

28. The semiconductor device according to claim 24, wherein the upper wiring layer comprises an underlying film including one of Ti, Zr, Hf, Ti silicide, Zr silicide and Hf silicide.

29. The semiconductor device according to claim 28, wherein the underlying film of the upper wiring layer directly contacts the upper surfaces of the via plugs.

30. The semiconductor device according to claim 29, wherein the Al containing film of the upper wiring layer is formed directly on the underlying film.

31. The semiconductor device according to claim 28, wherein an upper surface of the upper wiring layer over the deepest via hole is substantially flat.

32. The semiconductor device according to claim 24, wherein an upper surface of the via plug in the deepest via hole has a convex shape.

33. The semiconductor device according to claim 32, wherein an upper surface of the upper wiring layer above the deepest via hole is substantially flat.

* * * * *